United States Patent
Baeg

[19]

[11] Patent Number: 5,812,562
[45] Date of Patent: Sep. 22, 1998

[54] LOW COST EMULATION SCHEME IMPLEMENTED VIA CLOCK CONTROL USING JTAG CONTROLLER IN A SCAN ENVIRONMENT

[75] Inventor: Sanghyeon Baeg, Cupertino, Calif.

[73] Assignee: Samsung Electronics Company, Ltd., Rep. of Korea

[21] Appl. No.: 749,858

[22] Filed: Nov. 15, 1996

[51] Int. Cl.⁶ .................................................. G01R 31/28
[52] U.S. Cl. ..................................... 371/22.31; 371/22.36
[58] Field of Search ................................. 371/22.3, 22.6, 371/22.5, 22.31, 22.32, 22.36, 27.7, 22.1; 395/183.06, 183.15, 183.1, 500, 183.03, 183.19; 364/579

[56] References Cited

U.S. PATENT DOCUMENTS

| | | | |
|---|---|---|---|
| 4,860,290 | 8/1989 | Daniels et al. | 371/25 |
| 5,313,470 | 5/1994 | Simpson et al. | 371/22.3 |
| 5,329,471 | 7/1994 | Swoboda et al. | 364/578 |
| 5,434,804 | 7/1995 | Bock et al. | 364/579 |
| 5,479,652 | 12/1995 | Dreyer et al. | 395/183.06 |
| 5,488,688 | 1/1996 | Gonzales et al. | 395/183.1 |
| 5,497,378 | 3/1996 | Amini et al. | 371/22.3 |
| 5,510,704 | 4/1996 | Parker et al. | 324/158.1 |
| 5,519,715 | 5/1996 | Hao et al. | 371/22.3 |
| 5,524,114 | 6/1996 | Peng | 371/22.1 |
| 5,535,331 | 7/1996 | Swoboda et al. | 395/183.21 |
| 5,546,568 | 8/1996 | Bland et al. | 395/550 |
| 5,608,736 | 3/1997 | Bradford et al. | 371/22.3 |
| 5,614,838 | 3/1997 | Jaber et al. | 324/765 |
| 5,623,503 | 4/1997 | Rutkowski | 371/22.3 |

*Primary Examiner*—Robert W. Beausoliel, Jr.
*Assistant Examiner*—Nadeem Iqbal
*Attorney, Agent, or Firm*—Skjerven, Morrill, MacPherson, Franklin & Friel, LLP

[57] ABSTRACT

An integrated circuit includes a test port operating at a first clock speed and at least one functional logic block operating at a second clock speed which is faster than the first clock speed. A control register, formed by boundary scan cells, operates at the first clock speed and provides control inputs to the functional block to control emulation tasks. The control register is writable via a serial shift operation through the test port while the functional block is operating. The outputs of the control register which are being provided to the functional block are held constant during the serial shift operation. An observation register, formed by boundary scan cells, operates at the first clock speed, and is readable through the test port via a serial shift operation, while the functional block is operating. The observation register receives signals from the functional block indicating status of the functional block.

5 Claims, 6 Drawing Sheets

LOW COST EMULATION SCHEME IMPLEMENTED VIA CLOCK CONTROL USING JTAG CONTROLLER IN A SCAN ENVIRONMENT

DESCRIPTION OF THE RELATED ART CROSS-REFERENCE TO RELATED APPLICATIONS

This application relates to copending applications, application Ser. No. 08/733,132, filed on Oct. 18, 1996, entitled "ADAPTABLE SCAN CHAINS FOR DEBUGGING AND MANUFACTURING TEST PURPOSES", by Baeg, application Ser. No. 08/733,908, filed on Oct. 18, 1996, entitled "CLOCK GENERATION FOR TESTING OF INTEGRATED CIRCUITS", by Baeg and Yu, and application Ser. No. 08/733,817, filed on Oct. 18, 1996, entitled "STRUCTURE AND METHOD FOR SDRAM DYNAMIC SELF REFRESH ENTRY AND EXIT USING JTAG", by Qureshi and Baeg, which are commonly owned and which are incorporated herein by reference.

BACKGROUND OF THE INVENTION

Integrated circuits have increasingly incorporated the JTAG (Joint Test Action Group) test port to facilitate testing and debug of integrated circuit chips mounted on a board. The JTAG standard has been adopted by the Institute of Electrical and Electronics Engineers and is now defined as IEEE Standard 1149.1, IEEE Standard Test Access Port and Boundary-Scan Architecture, which is incorporated herein by reference. See also C. M. Maunder, R. E. Tullos, "The Test Access Port and Boundary-Scan Architecture," (IEEE Computer Society Press, 1990), which is also incorporated herein by reference.

The JTAG test port (Test Access Port or TAP) has been utilized as a means for emulating and debugging VLSI designs. That is possible because JTAG provides control and observability to the core logic portions of the integrated circuit through scan access. However, some prior art emulation approaches using JTAG have utilized a complex interface between core logic and the JTAG port. That is in part because the JTAG port typically operates at a test clock frequency which can be an order of magnitude slower than the system clocks provided to the functional logic within the integrated circuit. For example, U.S. Pat. No. 5,535,331 describes one such relatively complex interface scheme between the JTAG controller and functional logic contained within the integrated circuit. Additionally, in many JTAG applications, it is necessary to stop the system clocks in order to obtain status information about the functional blocks. It would be desirable to have an expandable and flexible interface between the JTAG port and the core logic blocks on VLSI chips that is simple, does not require extensive redesign for each new application and provides access to status of the core logic blocks without having to stop the system clocks each time.

SUMMARY OF THE INVENTION

Accordingly, this invention provides a simple and expandable approach to providing emulation of VLSI chips using a test interface such as JTAG. In one embodiment of the invention a method is provided for operating an integrated circuit which includes at least one functional logic block operating with a system clock at a first clock speed and a test port operating with a test clock at a second clock speed, the second clock speed being lower than the first clock speed, the test port being controlled by a test controller external to the integrated circuit. The method selects as a scan address a first control register, via the test port, with a first test instruction. Updated control values are shifted into the first control register at the second clock speed, and the output of the first control register which is being provided to the functional logic block, does not change during the shifting. Updated control values are then loaded from a first portion into a second portion of the control register to provide the updated control values to the functional logic block.

Additionally, the updated control values may include a stop clock request flag bit, indicating to the functional logic that the test controller wishes to stop the system clocks, the shifting and loading step which asserts the stop clock request flag bit taking place while the system clocks are active. The functional logic responds to the stop clock request flag by going into an idle state by completing pending instructions in an instruction stack and providing an idle signal to a second control register indicating that the functional logic has gone to the idle state. The method may also include the steps of monitoring the state of the second control register through the test port to determine when the idle signal is asserted by the functional logic and once the idle signal has been detected by the test controller, shifting and loading updated control values, the control values including a stop clock control bit asserted to indicate to a clock control logic block, to stop the system clocks.

BRIEF DESCRIPTION OF THE DRAWINGS

The present invention may be better understood, and its numerous objects, features, and advantages made apparent to those skilled in the art by referencing the accompanying drawings, wherein the use of the same reference symbols in different drawings indicates similar or identical items.

DESCRIPTION OF THE PREFERRED EMBODIMENT

Figure 1:
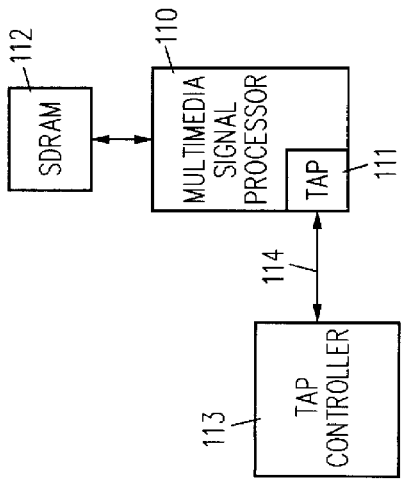
FIG. 1 is an overview of the test environment.

FIG. 1 illustrates a simplified overview of the test environment of one embodiment of the invention. Integrated circuit (IC) 110 includes TAP 111 to facilitate testing and debugging the integrated circuit and applications intended to run on the integrated circuit IC 110, may be, e.g., Multimedia Signal Processor (MSP™) developed at Samsung Semiconductor, Inc. of San Jose, Calif. That processor, which includes a 32 bit RISC microcontroller (ARM7) and a vector processor engine for digital signal processing, is described in U.S. patent application Ser. No. 08/699,303 filed Aug. 19, 1996 by C. Reader et al. and entitled "Methods and Apparatus for Processing Video Data", which is incorporated herein by reference. The MSP testing circuitry is described in more detail in Appendix A attached hereto. IC 110 is also coupled to external devices, e.g., SDRAM 112. A TAP controller 113 controls debug and emulation of IC 110 through TAP 111 over JTAG bus 114. Note that the embodiment described herein assumes a JTAG implementation. However, the invention is equally applicable to other serial test interfaces on VLSI chips.

The JTAG port 111 can function as a control circuit for boundary scan testing in accordance with the JTAG standard. In addition to boundary scan testing defined by JTAG, TAP 111 is suitable for internal testing as defined below.

Figure 2:
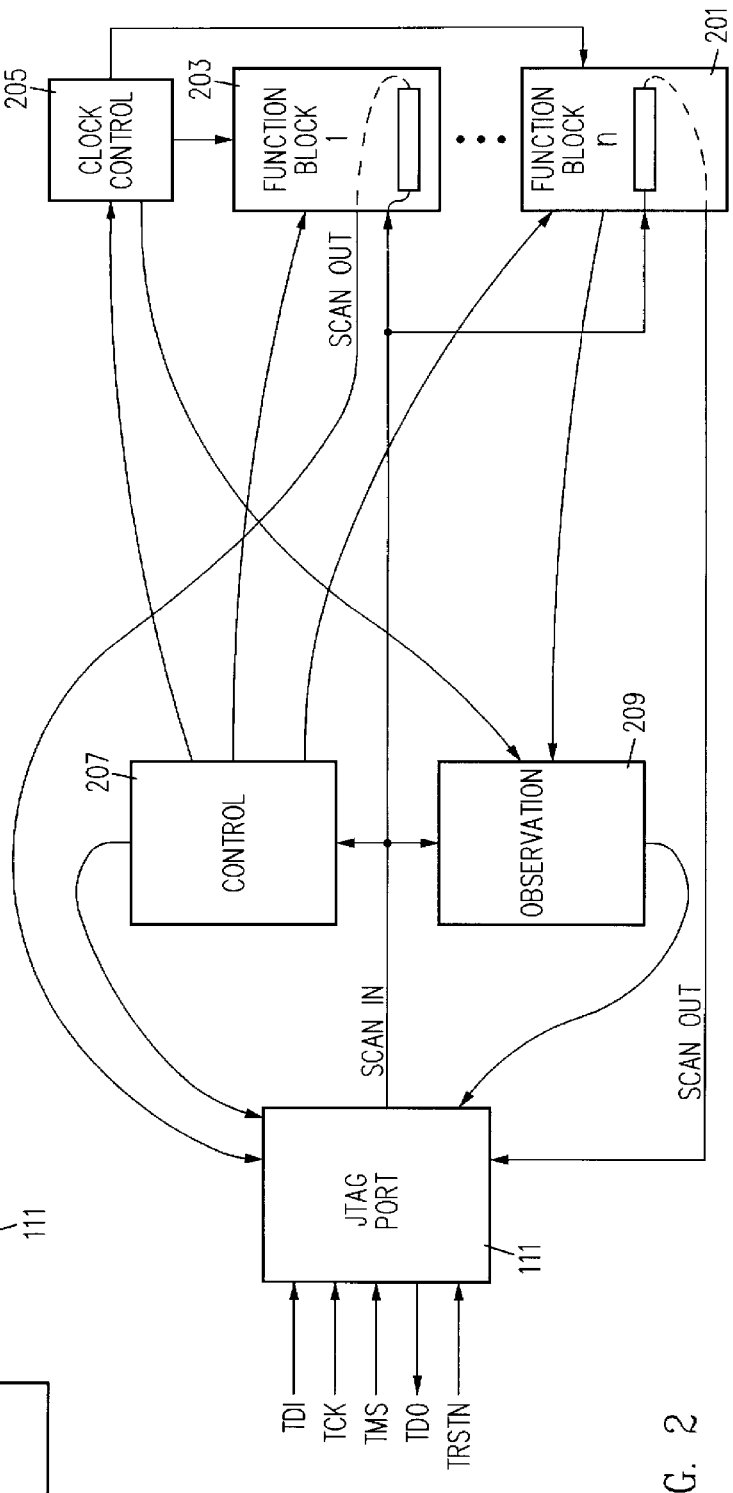
FIG. 2 is a more detailed look at the test architecture of an integrated circuit according to the invention.

Referring now to FIG. 2, the test architecture of IC 110 is shown in more detail. The JTAG port 111 includes 5 pins defined by the JTAG standard that constitute bus 114. The JTAG standard requires four signals (a fifth being optional) interfacing the Test Access Port (TAP) on the integrated circuit. The TAP input signals include a test clock (TCK), a test mode select (TMS) which acts as a control signal, a test data in (TDI) to receive serial data and commands, and an optional test reset (TRSTN). A test data output (TDO) provides serial output from TAP 111 to TAP controller 113. The clock input on pin TCK is used not only during the JTAG boundary scan testing, but also for internal testing. In particular, the pin TCK provides scan clock signals for scanning data in and out of internal scan chains as well as providing clocks for pseudo-system clocks, wherein the system clocks operate at TCK frequency.

Emulation of a DSP chip can be implemented using a scan test interface such as JTAG to control internal functional blocks such as clock generation block 205 and internal functional blocks 203 and 201. Emulation (e.g., testing and debug of the chip and applications which are being developed for it) of a digital signal processor (DSP), which is one of the functional blocks contained on the MSP, requires such capabilities as single stepping through instructions, setting break points, reading, and writing (i.e. controlling) the important registers for a system operation such as the program counter, status register(s), and the cache RAMs. In today's emulators, an emulation block is usually designed to achieve such emulation tasks while allowing free running system clocks, which requires extra design time as well as silicon area and extra I/O pads for emulation purposes.

By controlling the system clocks using JTAG, the functions required for chip emulation can be implemented relatively easy with a minimum cost of design time and silicon penalty. The control necessary includes bypassing (i.e. stopping) free running system clocks, clocking for single or multiple cycles, and enabling free running clocks to go back to normal operation. The communication between JTAG controller and other functional blocks can be made using two special registers, which resolve the asynchronous relationship and speed gap between TCK and system clocks. In the embodiment described herein, the TCK operates at 10 MHz and while the fastest system clocks operate at 80 MHz.

Referring again to FIG. 2, the communication between the clock control block 205 and the JTAG controller is made using the two special registers, Mode Control Register (MCR) (207) and Observation Control Register (OCR) 209. The registers are part of the JTAG controller in that they are clocked by the JTAG clock, TCK. Note that TCK and the other system clocks are totally asynchronous. Synchronization problems between JTAG Controller 110 and the non-test circuitry are avoided through the use of the two shift registers, MCR 207 and OCR 209.

Figure 3:
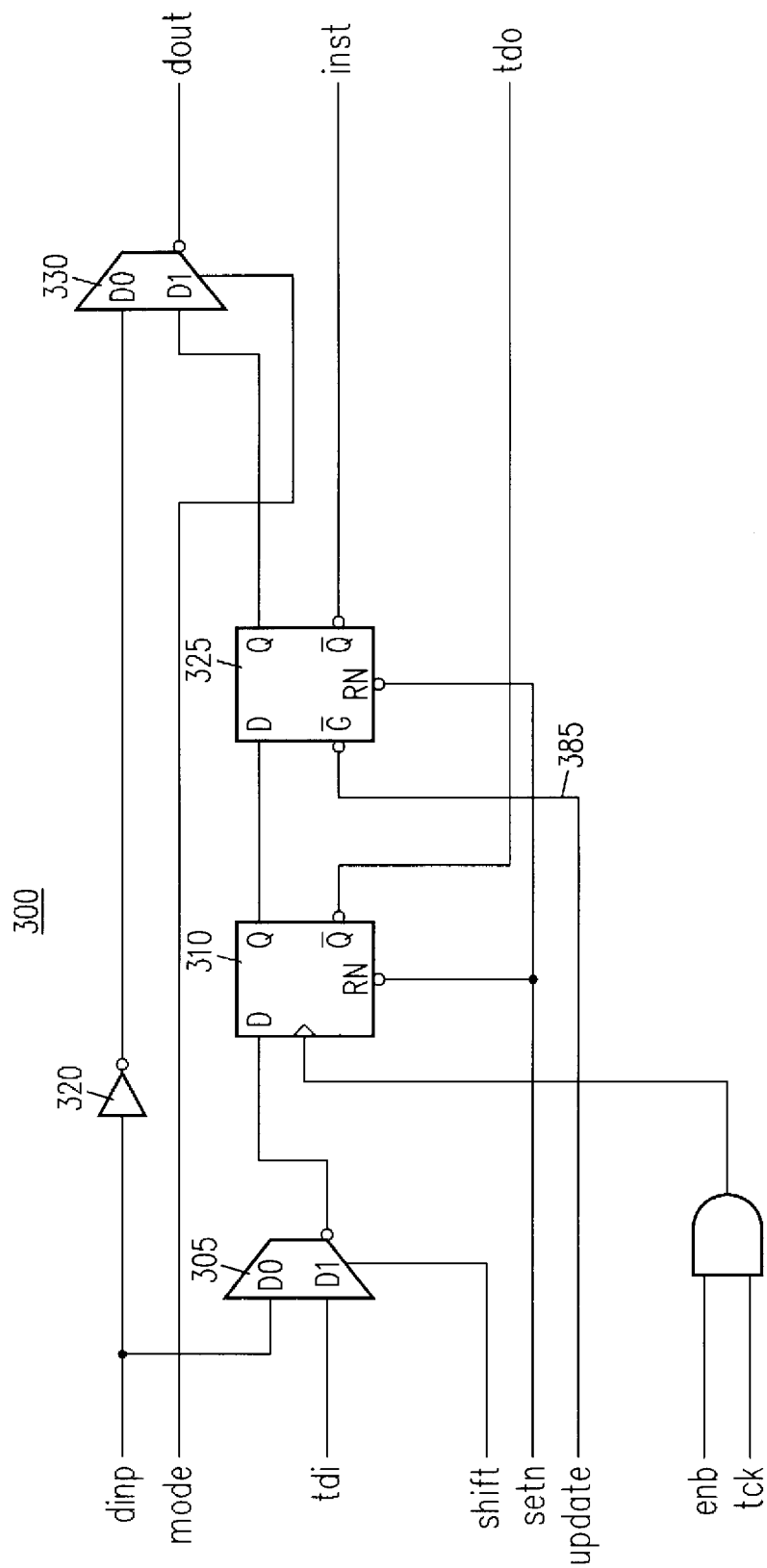
FIG. 3 is a boundary scan register cell.

The mode control register (MCR) 207 controls the clock control logic 205 and internal function blocks. In one embodiment MCR 207 contains 40 control bits including bits to control clocks and perform handshaking with the functional blocks. See Table 12 in Appendix A showing the contents of the MCR register and in Table 14, the section entitled "JTAG Output Signals from MCR register" for additional details on the MCR register. The observation control register (OCR) 209 receives handshake responses from the clock control logic 205 and the function blocks and can be used to observe internal states of the integrated circuit, as well as off chip memory locations. See Table 13 in Appendix A for additional details of the OCR. The MCR and OCR registers are operated using the JTAG clock, TCK, which is asynchronous with system clocks. Shift registers MCR 207 and OCR 209 are special shift registers consisting of a plurality of boundary register cells where data can be serially shifted through each register cell without destroying the existing contents of that register cell. It is necessary to shift data, i.e., a new control word, into the MCR while maintaining the previous values, so that control bits to the functional logic do not toggle with each serial shift operation, thereby setting the internal logic blocks into unknown states. An example of a boundary cell utilized for the MCR and OCR registers in a preferred embodiment is shown in FIG. 3 and will be discussed further herein.

Generally, to use the JTAG port for debug and emulation purposes, the system clocks are stopped and the JTAG controller can scan data in/out to/from all scan flip-flops and set a program counter, set next break address/data break points, and many other control registers to control the design. If a DSP or other internal processor implements address/data break points, instruction stepping is possible. Otherwise, cycle based stepping is supported. Generating single/multiple clocks are implemented using a counter in the clock control logic 205 which uses the count value contained in bits 1–10 of the MCR.

The debugging steps for use with the MSP can be described as follows. In some debugging scenarios a handshaking sequence is implemented with the functional blocks to ensure the blocks are in a known state before the clocks are stopped. In some debugging scenarios it may be appropriate to simply stop the clocks without the handshaking sequence. When a handshaking sequence is appropriate, the first step in the sequence is to issue a stop clock request signal to the functional blocks. The clock stop request can be issued through JTAG by shifting in a custom JTAG instruction MCR/BIST1 or MCR/BIST2 which will select the MCR for a subsequent shift DR instruction. Then the appropriate control bits are serially shifted into the MCR with the stop clock request bit (jtag_clk_stop_req) asserted. The (jtag_clk_stop_req) bit acts as a handshaking signal telling the functional blocks that JTAG wants to stop the clocks. Because the MCR is accessed serially, while system clocks are running, it is necessary that the MCR control outputs be stable while the new data is input into the MCR. Therefore, the MCR is implemented using a boundary scan latch design discussed previously. At the end of the serial shifting operation, the JTAG includes an update DR state which causes the data to be updated into the shadow latch portion of the MCR, i.e., that portion of the register that is stable during shifting. As the JTAG port goes through the JTAG update state, the new values are loaded into the MCR shadow registers and the flag (jtag_clk_stop_req) is broadcast to all necessary functional blocks.

In response to a request to stop clocks, (jtag_clk_stop_req) in the MCR, a function block may respond as follows. For example, if the vector processor in the MSP is running and receives this handshaking signal, it will complete operation of the instructions in its instruction queue and then return to the idle state. When it returns to the idle state, the vector processor will assert the vp_idle signal provided to the OCR.

The next debugging step consists of observing the internal state of the integrated circuit. It is necessary to know when to step into the JTAG controlled modes from the normal mode (i.e., system clocks running normally). In this observation mode, the internal state can be observed through the OCR. The clock stop will not be activated until the JTAG controller observes all the necessary response signals from the functional blocks indicating that they are in a satisfactory state to stop the clocks. While the MSP is executing its operations, the states can be observed through TDO pin utilizing the Monitor instruction. The TAP controller issues the Monitor instruction (see Table 11 in Appendix A) which selects the OCR as the register addressed for the subsequent DR operation. The TAP controller can repeatedly access the OCR within a DR instruction until certain bits in the OCR, e.g., bit 1 (vp_idle), are asserted, indicating the VP and/or other functional blocks are ready for their clocks to be stopped. The handshaking scheme allows the vector processor and other internal logic as needed, to reach a known state before an emulation task, such as single cycle or multicycle is begun or a scan out is performed.

Once all necessary states have been observed, all system clocks can be stopped. In order to scan internal registers, it is necessary to stop system clocks going to the registers desired to be scanned. In implementations providing the capability, one can selectively stop the clocks depending on how the values are set up in the MCR. If selective stopping is not supported, all system clocks will be stopped as presently implemented in the MSP. A block with system clocks active can not be scanned. The clock stop signal is being issued while the MSP is running with system clocks. Any of the four instructions, MCR/BIST1, MCR/BIST2, MCR/BIST3, and MCR/BIST4 can be used to issue the clock stop signal. MCR/BIST1 and MCR/BIST2 can issue the signals while boundary scan cells are in transparent mode, i.e., input signals external to the chip are entering the chip. The latter two instructions can issue the clock stop signals while all input signals are blocked. See Tables 4–11 in Appendix A for additional details on JTAG instructions executed by TAP 111.

Subsequently, a new MCR load operation takes place to stop system clocks. Thus, an instruction is sent to the JTAG port selecting the MCR as the data register and data is serially shifted in to the MCR to assert bit 11, sys_clk_bypass, which will stop the system clocks synchronously as described in greater detail in "CLOCK GENERATION FOR TESTING OF INTEGRATED CIRCUITS", by Baeg and Yu, discussed previously. Then the MCR can be loaded with another instruction to determine, e.g., whether the clocks are to be cycled at system speed or to use pseudo system clocks (system clock at TCK speed). As discussed, a 10 bit cycle count (MCR bits 1–10) can be specified. The cnt_start bit in the MCR will cause the clock control logic to generate the number of clocks specified in the clock count bits of the MCR. The MCR can control the clock control logic so that the cycle count is executed with regular system clocks or with a clock derived from TCK.

The MCR can also be used to access on-chip memory (MCR bits 18–32), as well as to initiate memory testing for the on-chip memory. Other flexible debug features can be easily implemented by using the MCR. For instance, where additional control is desirable over the boundary scan chains, the MCR can include bits to specifically control the mode signals provided to the boundary scan chains from the MCR rather than from the TAP, e.g., from decode of boundary scan test instructions. Thus, bit 34 (mode_sig_control) can be used to indicate that the mode signal, normally provided to the boundary scan chains from TAP 111, is being overridden by the MCR and the mode bits in the MCR (bits 35–39) will control the mode signal provided to the boundary scan strings. See Table 12 in Appendix A for additional details on MCR bits 34–39.

The flexibility inherent in the MCR design approach to control emulation tasks can also be seen in the use of bit 17 (em_status). In one MSP implementation, the vector processor is slaved to the general processor ARM7 and returns control to ARM7 after finishing a task. However, by asserting the em_status bit in the MCR register, the vector processor will not return control to ARM7 after completion of a task. Thus, adding one bit in the MCR provides a convenient debugging tool for the present design. As newer generations of a design are generated, additional control bits can be easily added to the MCR to control as yet unforeseen debug tasks with a minimum impact in design time and silicon.

Once the TAP controller has issued the MCR instructions to cause the clock control logic to generate the specified number of system clocks. The OCR is monitored using the monitor instruction as described previously, to wait for assertion of a handshaking signal from the clock control logic, req_acom, indicating that the request to the clock control logic has been completed. At this point, the TAP controller can then scan any of the available scan strings.

Once clocks are stopped, before or after a cycle instruction, internal scan operations of the functional logic can take place. TCK provides scan clocks for internal scan chains, shown in FIG. 2, by way of example, as scan chains 201 and 203. Each scan chain includes a number of shift register latches whose design is known in the art. Some embodiments of IC 110 include more than 17 scan chains or fewer than 17 scan chains. For one MSP embodiment, the 17 scan chains, and the respective MSP function blocks incorporating these chains, are shown in Appendix A, Table 2 as chains 1–17. (Chain 18 is the MSP boundary scan chain. Chain 19 is the boundary chain of the ARM7 processor embedded in the MSP.) Each internal chain in Table 2 is a JTAG test data register which can be selected by a respective JTAG custom instruction listed in Appendix A, Table 5. Instructions 9–10 (see Appendix A, Table 4) are used to scan the boundary of ARM7 blocks. The instructions 12 through 28 can be used to scan the functional blocks. Instructions 35 and 36 can be used to generate the pseudo system clocks, which are coming from TCK. Before the clocks are restarted, it is necessary to setup in MSP appropriately. For instance, breakpoints and/or control registers need to be set up for the particular task to be performed.

Finally, system clocks can be restarted by setting the values in the MCR. Instructions 30–33 can be used to access the MCR to start the clocks. The clocks are started by deasserting bit 11 of the OCR (sys_clk_bypass).

One of the great advantages of the present method can be found when this scheme is extended to be used for silicon debugging during the prototype developing. Since it enables emulating the silicon at-speed by implementing the protocol between the JTAG controller and system blocks, timing related design problems can be debugged.

FIG. 3 shows a schematic of a boundary register cell 300 which can be used to build the MCR and OCR. The cell 300 can transmit an input signal dinp with or without storing the value of signal dinp in flip-flop 310. In boundary register cell 300, input signal dinp is input through multiplexer 305 to flip-flop 310 and through inverter 320 and multiplexer 330 as an output signal dout. Multiplexer 305 selects either tdi on or dinp according to the level on the multiplexer control signal, "shift". The use of flip-flop 310 and 325 allows data to be shifted into flip-flop 310 while latch 325 preserves an output signal inst. Multiplexer 330 selects whether output signal dout is from latch 325 or input signal dinp.

If the signal tdi is selected by multiplexer 305, data (tdi) may be shifted through register cell 300 by shifting data into flip-flop 310 while a signal update on lead 385 coupled to latch 325 remains high. Latch 325 retains the previously latched data on terminal Q of latch 325. An output signal tdo from flip-flop 310 is input into an identical adjoining register cell 430 (see FIG. 4) as the signal tdi at a clock edge if the clock signal tck is enabled by AND gate 315 and signal enb. Clock signal tck and the signal enb input to AND gate 315 which is coupled to the clock terminal of flip-flop 310.

To change output signal inst from register cell 300, signal update is asserted low which causes latch 325 to latch the output signal from flip-flop 310 so that new value inst is now provided by register cell 300. Signal inst is the content of register cell 300 which is output to, for example, as MCR signal sys-clk bypass.

Figure 4:
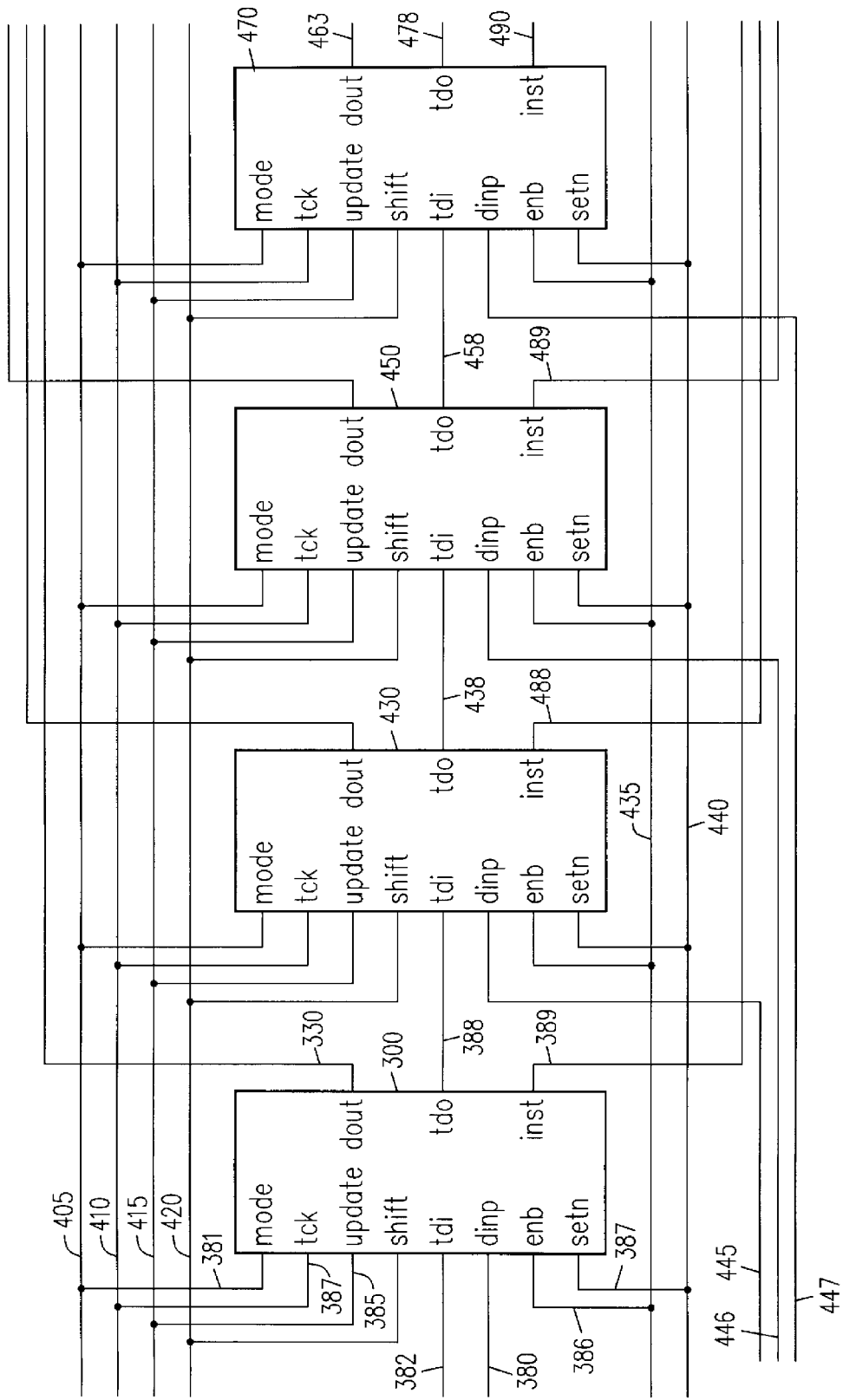
FIG. 4 shows several boundary scan register cells coupled together to form a special interface register according to the invention.

FIG. 4 shows how register cell 300 (shown in detail in FIG. 3) may be coupled together with other register cells in one embodiment of a register such as MCR 207 or OCR 209. Four register cells of a register are shown in FIG. 4, and the interconnect scheme can be repeated to produce a register of the desired size. The signals mode, tck, update, shift, enb, and setn are on leads 405, 410, 415, 420, 435, and 440, respectively, and couple to register cells 300, 430, 450, and 470 in parallel. A data input signal dinp may be provided from TAP 211 to register cell 300.

When the registers are configured as the MCR, the signals inst or dout from register cells 300, 430, 450, and 470, are coupled to desired locations in the functional blocks. For example, in one embodiment, a register cell of MCR 207 may provide, on the signal inst, jtag_clk_stop_req. Similarly, the last register cell in OCR 209 is coupled to the JTAG port. The last register cell will be coupled to the TAP so data can be serially shifted out while the first register cells in both the MCR and OCR will typically be coupled to TAP signal TDI. When the registers are configured as the OCR, parallel inputs will come into each cell and be loaded into flip-flop 310. Subsequently, the data can be latched into latch 325 with assertion of a capture signal from the TAP which would be connected to the update line.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

APPENDIX A

Test and normal modes in MSP are described in this chapter. All those modes are controlled by a JTAG controller using five JTAG pins only.

1.2 Application and Assumptions

All the test schemes, which are described in the following sections are implemented to aid MSP hardware testing during the processes of both prototype debugging and manufacturing test.

This material assumes that users know IEEE 1149.1 JTAG protocols and LSSD type scan properties. Please refer to following material for more information in LSSD, JTAG, and MSP specification.

Test Compiler Reference Manual Ver. 3.2a (Synopsys, Inc. 1994)

IEEE Standard 1149.1–1990: IEEE Standard Test Access Port and Boundary Scan Architecture, 1990

Preliminary MSP-1EX System Specification, Samsung Semiconductor Inc. 1996.

1.3 Features

LSSD type scan design

Independent scan operation for each functional block

Parallel scan operation for manufacturing test

Two boundary scan chains for MSP and ARM7

All JTAG basic instructions, intest, extest, and sample/preload

Memory access operation

BIST clock generation 1.4 Test Methodology Abstract

MSP testing is aided with various test schemes, which incorporate LSSD (Level Sensitive Scan Design) type scan design, JTAG controller, and mixing techniques of DFT (Design For Testability) and BIST (Built In Self Test) for memory test.

The control blocks in MSP are made to be fully scannable. The data path blocks are partially scanned to reduce hardware penalty. The scan chains are partitioned by functional block to aid debugging.

There are two boundary scan chains for MSP and ARM7, which are controlled using one JTAG controller. The JTAG control logic is able to scan boundary scan chains as well as the internal scan chains.

To debug and test in silicon, hybrid DFT method is used for the cache memory. It is a combined method of DFT, JTAG, and BIST. The automatic comparison scheme has been embedded for cache to reduce test time while MARCH C algorithm is executed. The memories are controlled using memory control register located inside the JTAG controller.

1.5 Conceptual JTAG Requirements

The general requirements that JTAG controller should provide are discussed. They are specified in the points of functional debugging rather than board level testing.

Boundary scan for MSP and ARM7 core: arbitrary functional vectors should be supplied to the scan chain, which implies that a clock pulse in clock pads can be emulated through the scan chain. The tri-state and bi-directional controls should be possible in a group of related signals such as data bus. Arbitrary patterns from the off-chip and internal logic are captured and shifted to TDO pin. It should be able to drive the external chip and internal logic via the boundary scan cell for interconnection test and internal logic testing respectively. At least one of boundary scan operation guarantees that all the internal state machines are frozen until the boundary scan cells are updated by JTAG controller.

Scan in/out test for functional blocks: scan chains are partitioned by the functional block unit. Exceptions can be made if a block has much less scan cells compared to other blocks. Scanning in and out arbitrary values should be possible for every scan cell. During the scan operations for functional blocks, all the internal ff/latches except the selected chain, boundary scan cells, cache, and register should hold the previous values. This is critical for efficient silicon debugging process. In other words, all the data registers, boundary scan, ARM7 boundaries scan should be independently controllable.

Generation of system clock in test mode: the MSP chip is executed as many system clock cycles as users want.

This is performed in two ways in terms of clock pulse generation. First, the clock pulses are generated using boundary scan cell assigned to clock ports. This will be extremely slow because it requires scanning all the boundary scan cells three times to create one pulse (0-1-0). In case of the system clock this feature is not supported. The capture only boundary scan cell is used. If the TCK is 20 MHz, about 24 Khz clock can be emulated using the boundary scan chain in MSP. Note that the boundary scan length in MSP is 270 bits long. Secondly, the clock pulse can also be generated using the JTAG clock. One pulse of the JTAG clock, TCK is the same as one system clock pulse. This is very fast compared to the previous one. The second way of clock generation is implemented for the main system clock only. Other clocks are emulated using the boundary scan chain.

Embedded memory access via JTAG: the memories, IDC and register file inside MSP are controlled through JTAG interface in test mode. Read and write operation to an arbitrary location are provided. Any read/write operations to one RAM should not affect the contents in the other RAMs.

Multiple independent scan: the multiple scan chains are configured based on the number of scan cells rather than functional blocks. They are scanned simultaneously. JTAG controller is responsible for providing the circuitry of the scan chain reorganization.

JTAG instructions: all the basic JTAG instructions should be implemented in addition to the instructions to provide the functionalities specified in above items in this section. During JTAG instruction change, all the boundary scan cells are not changing, all ff/latches freeze their state, and memories hold their current contents. This will help predict the current state during the prototype debugging process.

1.6 Classified JTAG Operations

This section discusses the implementation issues of the JTAG requirements discussed in the previous section. JTAG operation in MSP design can be classified into six different categories. Each category can have a little variation depending on its application. You will see the matching instructions for the categories in the section of JTAG design details. The six different categories are normal operation, boundary scan operation, single internal scan operation, memory access operation, multiple internal scan operation, and pseudo system clock operation modes. They are discussed in the following subsections.

1.6.1 Normal Operation

All the functional and memory blocks are operating as they are supposed to. All the shared input and output pins and test logic are properly redirected to provide legal signals in this mode. This mode is entered by enabling JTAG standard signal, TRST_N (=0).

1.6.2 Boundary Scan Operation

Two boundary scan chains are implemented. They are for MSP and ARM7 core. All the I/O ports in MSP and ARM7 have their appropriate boundary scan cells except the five JTAG related pins. The specific boundary scan cells for the scan chains can be found in the sections of MSP boundary scan and ARM7 boundary scan. The two boundary scan chains will share one JTAG controller and must be independently scannable. Intest, extest, and sample/preload instructions for both scan chains are implemented.

1.6.3 Single Internal Scan Operation

In this mode, JTAG takes over the hardware control in terms of data transfer inside MSP. All the functional blocks, which have scan chains in them can be independently scanned in or out. "Independently" means that the scan chains which are not selected do not change their states. Only the selected block takes a scan input from TDI port and updates the scan chain.

This scan mode is primarily used for chip debugging. You can set and observe the values in scan chains whenever you want. Since only one scan chain can be accessed at a time, it is as if there were only a single chain in terms of testing time. It is not a good candidate for production test even though it can be used for the purpose.

1.6.4 Memory Access Operation

The vd_ram and tag_ram in IDC (Instruction Data Cache) are selected and accessed at the same time. The data_ram can be independently accessed. Any address in the RAMs can be independently read and written in this mode. The memory operations are executed serially by scan chain and JTAG controller.

When one memory is accessed for read and write operations, the other memories do not change their contents. Below is how you access the memories.

1. Change to single scan mode and select the RAM block. Scan in the necessary data. At this time, you can set the address counter, and the data to be written. Since this is the scan mode, no memory write operation should be performed.
2. Go out of single scan mode and step into memory access operation. In this mode, a memory to be tested can be selected. JTAG controller provides a select signal for each memory. They are data_ram_test_en, vt_ram_test_en, and register_file_test_en. Only one of them can be active at a time.
3. Once one memory is selected, memory and address counter control signals can be controlled using JTAG. The control names are mem_we, mem_hwd, mem_compare, mem_add_u/d, mem_add_cnt, mem_add_reset, and mem_add_set. Their usages can be found in the section of JTAG interface signals.

1.6.5 Multiple Internal Scan Operation

In addition to the single scan mode, there is multiple scan mode in which 10 different scan chains are accessed simultaneously from MSP I/O ports. They are basically reorganized from the existing scan chains based on the scan ff/latch counts.

Multiple scan chain operation is implemented with production test in mind. 10 scan flip-flops can be accessed in every clock cycle. Furthermore, no JTAG instruction switching is necessary to have a specific function block scanned as in single scan mode.

The ten scan inputs are shared with normal functional bidirectional pins. The names are ad06_si0, ad07_si1, ad08_si2, ad09_si3, ad10_si4, ad11_si5, ad12_si6, ad13_si7, ad14_si8, ad15_si9. The ten test pins are muxed with the normal bidirectional pins, ad16_so0, ad17_so1, ad18_so2, ad19_so3, ad20_so4, ad21_so5, ad22_so6, ad23_so7, ad24_so8, ad25_so9.

The two input ports, tca and tcb are used for scan clock stimulus. Since the two ports are dedicated for testing, it does not give any limitation for test generation. Note that they are not coming from the JTAG controller but from a tester.

On the tester during manufacturing, MSP is set to multiple scan mode, in which the boundary scan cells are in transparent mode. So that all the test vectors in normal ports can be applied through boundary scan cells.

The signal which tells the JTAG is in the multiple state can be used to direct the bidirectional I/O cells. It avoids the preprocessing step to direct the bidirectional pins.

1.6.6 Pseudo System Clock Operation

After the scan chains have been loaded, some portion of MSP needs to be executed in single or multiple clocks during prototype debugging. JTAG controller generates two non overlapping clocks, jsca, jscb which will be muxed internally with the two system clocks, clk1, clk2. The main difference from the normal mode is clock source. In this mode, the clocks are coming from the JTAG controller instead of from system clock. It is called pseudo system clock. The clocks from the output of the muxes affect the system operation. Currently, the pseudo system clock is hooked up to the IDC block only. While the clocks are applied, other system clocks are frozen.

In this mode, you can apply JTAG generated clocks for the duration of user specified number of clock cycles.

port instead of scan clock port. Notice that the single scan and pseudo system clock modes are not supposed to happen at the same time. The clock is named as pseudo system clock because they are used for system execution rather than scan operation. The clocks will be denoted as psca, pscb.

Functional block in table 1 refers to any hardware module in MSP design. It could be multiplier, FALU etc. Memory blocks are either IDC or register file. Input pins refer to MSP input or inout pads except JTAG input pins. Output pins refer to MSP output or inout pads except TDO pin.

TABLE 1

General picture of MSP in test modes

| Classification | Modes | System clock (clk1/2) | Scan clock (jsca/b, tca/b) | Pseudo system clock (psca/b) | Functional blocks | Memory blocks | Input pins | Output pins |
|---|---|---|---|---|---|---|---|---|
| NORMAL | Normal | Active | Inactive, Inactive | Inactive | Normal | Normal | Used | Used |
| TEST MODE | Boundary scan | Inactive | Inactive, Inactive | Inactive | Frozen | Frozen | Boundary scan | Boundary scan |
| | Single scan | Inactive | Active, Inactive | Inactive | A block scanned | Frozen | Not used | Not used |
| | Memory test | Inactive | Inactive, Inactive | Active | Frozen | Normal | Not used | Not used |
| | Multiple scan | Inactive | Inactive, Active | Inactive | Multiple scanned | Frozen | Shared SI pins | Shared SO pins |
| | Pseudo sys clock | Inactive | Inactive, Inactive | Active | Frozen | Normal | Boundary scan | Boundary scan |

However, clock counting is not implemented inside the JTAG controller. It is provided through a proTEST-PC and AVL (see the section on "hardware test environment").

1.7 Signal Overview in the Test Modes

Figure 5:
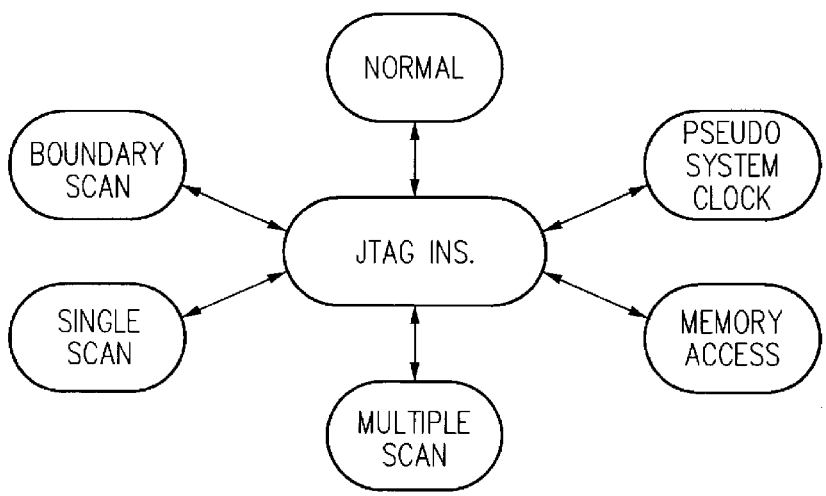
FIG. 5 is an overview of mode transition in JTAG.

The overview diagram is shown in FIG. 5. All six different modes can be entered through the JTAG instructions. This means there are no dedicated I/O pins to switch back and forth between the modes. A JTAG instruction should be loaded first before you go to the desired mode.

Figure 6:
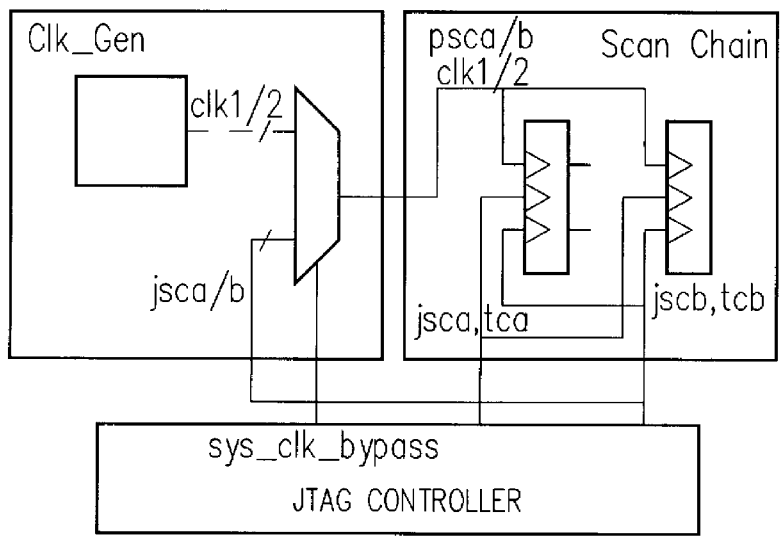
FIG. 6 shows the system and test clock circuit.

Table 1 shows the general picture of the important signals in the six different modes. Three kinds of clocks, system clock, scan clock, and pseudo system clock, are used to support the different test modes. The view of the clocks in MSP are shown in FIG. 6. System clock refers to the two non overlapping clocks, clk1 and clk2, which are derived from system clock. One of those will be connected to the normal clock port of scan flipflops and scan latches depending on the application.

Scan clock is two non overlapping clocks for scan operation, which will be connected to scan clock ports for every scan flipflops and scan latches. The scan clocks are generated by either JTAG controller or MSP input pads, tca and tcb. They will be selected appropriately depending on the test modes. In the single scan mode, two scan clocks, jsca, jscb are pulsed to a selected functional block and two clock ports, tca, tcb stay at logic 0. In the multiple scan mode, jsca and jscb stay at logic 0 and tca and tcb are enabled.

Pseudo system clock is also two non overlapping clocks which are generated by JTAG controller. They are the same signals as scan clocks, jsca and jscb. However they are going to a different place at this time, which is the normal clock In the normal mode, the system clocks, clk1, clk2 are pulsed, which basically executes the MSP as stated in the MSP specification. Scan clocks, sca and scb should not be active (sca=0, scb=0). If they are active, the scan flipflops and latches in the MSP go to unknown states. Pseudo system clock is inactive. So that the clocks which are carried to all sequential elements are coming from the system clock pin, mclk, instead of JTAG controller. All the test logic should not affect the normal functionality.

In the boundary scan mode, no clock is active. The boundary scan chains are shifting values via JTAG generated clocks. All functional blocks are freezing their states during scan operation.

In the single scan mode, only one block can be selected and scanned in or out using scan clocks. During this period, only five JTAG pins are accessed. Other I/O pins are not significant. For the same reason in normal mode, the system clock should not be active. All memory write should be disabled during this period.

In the memory test, the pseudo system clock is used for memory read and write operations. Input and outputs are not significant in this mode too since all data to be processed are in scan chain in the memory block. All the memory controls are steered by the memory control register which resides in JTAG control logic.

Multiple scan mode uses the scan clock which are coming from input pads, tca and tcb. The ten scan input ports and ten scan output ports are used to supply scan data instead of the JTAG port, TDI.

Pseudo normal mode uses the clock from JTAG to execute the MSP. In this mode the boundary scan cells at MSP I/O are not transparent but in intest mode. So that the input is steady in this mode.

1.8 Clock Control Scheme via JTAG Controller

Clock control scheme is incorporated to help the prototype debugging. The scheme implements clock stop, clock generation on demand, and clock restart. For the control signals, refer to special control registers in 1.10.4. Please refer to the clock specification for MSP clocks.

Clock stop: when clock stop request is made from JTAG controller to clock generator, the clocks to MSP, system clock, pci clock, and codec clocks stops at the first rising edge of each clock after clock stop request is made.

Clock stop request is made in two different ways. The first simple way is to issue the request regardless of the system state. The second way is to request after MSP is ready to stop clocks. JTAG controller broadcasts the clock shutdown notice to MSP and make stop request to clock generator after it recognizes the idle status from MSP. Currently, only vector core is implemented to issue its idle status to JTAG controller.

Clock generation on demand: Any number of clock cycles up to 1024 may be requested to clock generator through control register in JTAG controller. The number of clocks are for the system clock. Other clocks are generated in ratio with the system clock. The clocks which are generated on demand are the same as the original clocks. The request is made after the clocks are stopped.

Clock restart: when clock restart is requested, all the clocks start after the first rising edge of the clocks.

1.9 Global Reset Operation

System reset can be performed using the scan chains embedded in MSP chip. In this operation, the master reset signal goes low (active low) and remains there for the duration of reset operation.

Since the JTAG clock, TCK is not running in the normal operation, the system clock should be used to shift data into scan chains. Because the TCK is not running at this time, this can not be considered as one of JTAG instructions.

The functionality of this scheme is that when the master reset is low, the logic "0" value is shifted to all scan ff/latches. The conditions to be satisfied in reset operation are listed below.

- The system clocks "clk1" and "clk2", and all other clocks which affect the scan ff/latches need to be disabled (clk1=0, clk2=0). This guarantees that only one kind of clock, which is scan clock, is applied to the scan ff/latches. This requires adding control logic to clock ports.
- The system clock is used to generate the scan clocks, sca, scb. Since the scan operation need to be very slow, normal free running clock should not be used. The system clock will be divided by 2.
- The master reset should be low enough to shift the reset value to scan ff/latches. The failure of not satisfying it will cause improper operation.

This operation has been implemented inside the JTAG controller section. However, it is not decided yet if MSP is going to implement this operation,

1.10 JTAG Design Detail

This section describes MSP JTAG design issues, instructions, and their codes which are available. All the functionalities described in the previous sections can be achieved using the instructions described in this section.

The instruction decoder in JTAG controller was designed for a possible 38 custom instructions. Currently 1 instruction is reserved for a future application. Out of 36, 17 instructions have an associated internal data register.

Serial output of each data register and an instruction register is muxed and connected to the TDO pin. When selected, by an instruction, data from the TDI pin can be serially shifted through the selected data register, or the instruction register, and observed at the TDO pin.

In all JTAG circuits, MSB is the left most bit and the typical signal name looks like this "DATA[N:0]". When integrating with other circuits this standard should be followed, for correct signal interconnections.

1.10.1 Requirements

The following items must be satisfied for JTAG controller to properly operate.

- Input pins: TDI and TMS input pins must have an onchip pull-up register. If these pins are left unconnected by the user, JTAG controller inputs are still logic high. All JTAG input pins must be connected logic high or low level under all operating conditions, for proper operation of the JTAG controller.
- Clock skew: Boundary scan register being about 270 bit long clock drivers should be designed and laid out such that there is minimum skew between bit 0 clock input and bit 270 clock input. JTAG controller is designed to work up to clock frequency of 40 Mhz maximum.
- Clock condition: the clocks conditions to be observed during internal scan operation are listed below.
  1. The clocks going to the normal clock port in scan latches have to be disabled.
  2. The clocks going to the normal clock port in scan flipflops have to be disabled.

1.10.2 Internal Scan Chains in KBP

The internal scan chains for JTAG controller are organized by functional block unit for effective chip debugging purposes. All internal scan chains are listed in table 2. The current scan chain partition does not affect the final testing time during production because the scan chains will be reorganized for production test purposes based on the number of scan cells in a chain. However it does affect the way MSP chip is debugged.

TABLE 2

Scan chains for MSP

| Number | MSP Blocks in a chain | Number of scan cells (As of 6/21) | Comment |
|---|---|---|---|
| 1 | register file | 288 | LSSD scan ff chain |
| 2 | idc | 602 | LSSD scan ff chain |
| 3 | ifu, | ? | |
|   | exe, issue, | 759 | |
|   | decode | 4 | LSSD scan ff chain |
| 4 | ehu, | 183 | |
|   | lsu cntl, | 321 | |
|   | lsu address dp, | 154 | |
|   | aiu | 323 | LSSD scan ff chain |
| 5 | pci, | ? | |
|   | dma, asic i/f | 454 | LSSD scan ff chain |
| 6 | mcu, | 293 | |
|   | fbus arb, | 26 | |
|   | ccu cntl, ccu sm | 354 | LSSD scan ff chain |
| 7 | bp, | 159 | |
|   | bp dp, | 449 | |
|   | ad1843, | 132 | |
|   | ks119 | 277 | LSSD scan ff chain |
| 8 | i/o peri, i/o ccu i/f | ? | LSSD scan ff chain |
| 9 | falu | 1872 | LSSD scan ff chain |
| 10 | exe dp | 864 | LSSD scan ff chain |
| 11 | multiplier | 1024 | LSSD scan ff chain |
| 12 | ifu dp, | 160 | |
|    | dma dp | 976 | LSSD scan ff chain |
| 13 | isu_rd dp, isu_wr dp | 998 | LSSD scan ff chain |
| 14 | ccu data dp, | 1024 | |
|    | ccu addr dp | 154 | LSSD scan ff chain | a specific data register. Register selected shows the data register which can be accessed in each instruction.

Table 4 shows the instructions for boundary scan in MSP. Eight of them are for MSP boundary scan chain. They select either MSP boundary scan chain or bypass register depending on their application. When boundary scan chain is selected, vectors can be loaded into the scan chain. Otherwise, MSP boundary scan is not accessible.

Three instructions in table 4 are for the ARM7 boundary scan chain. They select the ARM7 boundary scan chain.

TABLE 2-continued

Scan chains for MSP

| Number | MSP Blocks in a chain | Number of scan cells (As of 6/21) | Comment |
|---|---|---|---|
| 15 | mcu dp | 1027 | LSSD scan ff chain |
| 16 | pci dp | 434 | LSSD scan ff chain |
| 17 | ad 1843 dp, ks 119 dp, | 160 144 | |

TABLE 3

Boundary scan cell and clock control

| Test Name | MSP Mode _I | MSP Mode _O | MSP Mode _C | ARM7 Mode _I | ARM7 Mode _O | MSP_bs_ disable | MCR disable | OCR disable | ARM7_bs_ disable | sys_clk_ bypass |
|---|---|---|---|---|---|---|---|---|---|---|
| normal | 0 | 0 | 0 | 0 | 0 | 0 | 0 | 0 | 0 | 1 |
| bypass | 0 | 0 | 0 | 0 | 0 | 0 | 0 | 0 | 0 | 1 |
| extest | 0 | 1 | 1 | 0 | 0 | 1 | 0 | 0 | 0 | 1 |
| sam/pre | 0 | 0 | 0 | 0 | 0 | 1 | 0 | 0 | 0 | 1 |
| intest | 1 | 1 | 1 | 0 | 1 | 1 | 0 | 0 | 0 | 0 |
| clamp | 1 | 1 | 1 | 0 | 0 | 0 | 0 | 0 | 0 | 0 |
| highz | 1 | 1 | 1 | 0 | 0 | 0 | 0 | 0 | 0 | 0 |
| vp sm/pre | 0 | 0 | 0 | 1 | 1 | 1 | 0 | 0 | 0 | 0 |
| MSP boun. | 1 | 1 | 1 | 0 | 0 | 1 | 0 | 0 | 0 | 1 |
| arm7 intest | 1 | 1 | 1 | 1 | 1 | 0 | 0 | 0 | 1 | 0 |
| arm7 extest | 1 | 1 | 1 | 0 | 1 | 0 | 0 | 0 | 1 | 0 |
| arm7 sam/pr | 1 | 1 | 1 | 0 | 0 | 0 | 0 | 0 | 1 | 0 |
| bist | 1 | 1 | 1 | 0 | 1 | 0 | 0 | 0 | 0 | 0 |
| gbist | 1 | 0 | 1 | 0 | 0 | 1 | 0 | 0 | 0 | 0 |
| mult scan | 0 | 0 | 0 | 0 | 0 | 0 | 0 | 0 | 0 | 0 |
| single scans in table 5 | 1 | 1 | 1 | 0 | 0 | 0 | 0 | 0 | 0 | 0 |
| MCR/BIST1 | 0 | 0 | 0 | 0 | 0 | 0 | 1 | 0 | 0 | 1 |
| MCR/BIST2 | 0 | 0 | 0 | 0 | 0 | 0 | 1 | 0 | 0 | 1 |
| MCR/BIST3 | 1 | 1 | 1 | 1 | 1 | 0 | 1 | 0 | 0 | 0 |
| MCR/BIST4 | 1 | 1 | 1 | 1 | 1 | 0 | 1 | 0 | 0 | 0 |
| Monitor | 0 | 0 | 0 | 0 | 0 | 0 | 0 | 1 | 0 | 1 |

TABLE 2-continued

Scan chains for MSP

| Number | MSP Blocks in a chain | Number of scan cells (As of 6/21) | Comment |
|---|---|---|---|
| | ehu dp | 864 | LSSD scan ff chain |
| 18 | msp bs | 270 | boundary scan |
| 19 | arm7 bs | 124 | boundary scan |

1.10.3 JTAG Instructions

JTAG instructions are described in tables 4 through 10. They are classified based on the JTAG operation classes discussed in the section of classified JTAG operations. "Test name" is the name of each instruction and imposes its application. The instruction code has to be shifted into the instruction register in the JTAG controller before accessing Table 3 shows the control signals for boundary scan cell and system clock bypass signal. There are four mode signals to control two boundary scan chains for MSP and ARM7, which are itemized below. Please refer to the table of JTAG I/O signals in the next section for the explanation of other control signals, MSP_bs_disable, ARM7_bs_disable, and sys_clk_bypass.

MSP Mode_I: MSP boundary scan input cell mode signal
MSP Mode_O: MSP boundary scan output cell mode signal
MSP Mode_C: MSP boundary scan control cell mode signal
ARM7 Mode_I: ARM7 boundary scan input cell mode signal
ARM7 Mode_O: ARM7 boundary scan output cell mode signal When a mode signal is low, the boundary scan cell becomes transparent to take inputs from normal input ports.

When it is high, the output of boundary scan cells depends on the update latch in the boundary scan cell. (Please refer to the KGL75 data book for the details about boundary scan cells).

Table 5 shows internal scan chains for all functional blocks which can be accessed via JTAG controller. There is only one instruction for multiple scan mode in table 6.

The table 7 shows the memory access instructions. Three memories in IDC block can be controlled by JTAG controller. Data RAM and register file have their own instructions. Vd RAM and Tag RAM are accessed simultaneously. There is one more instruction available for future. It could be for ROM or another embedded RAM. MCR is memory control register which is located in JTAG controller.

Table 8 shows the default instruction when system is powered up. Table 9 shows the instruction for generating pseudo system clock which is actually coming from the JTAG pin TCK rather than the system clock. Thus you can control the number of clock cycles via the JTAG interface. Table 10 shows the available instructions for future application.

TABLE 4

Boundary scan instructions

| Number | Test Name | Instruction Code MSB LSB | Comment | Register Selected |
|---|---|---|---|---|
| 1 | Bypass | 111111(3f) | Mandatory test/code | Bypass Reg. |
| 2 | Extest | 000000(00) | Mandatory test/code | MSP BS |
| 3 | Sample/ Preload | 000001(01) | Mandatory test/user defined code | MSP BS |
| 4 | Intest | 000010(02) | Optional, user defined code | MSP BS |
| 5 | Clamp | 000011(03) | Optional, user defined code | Bypass Reg. |
| 6 | HighZ | 000100(04) | Optional, user defined code | Bypass Reg. |
| 7 | VP sample/ preload | 111011(3B) | Custom | MSP BS |
| 8 | SDRAM | 110110(3C) | Custom | SDRAM interface portion of MSP BS |
| 9 | ARM7 sample/ preload | 111001(39) | Custom | ARM7 |
| 10 | ARM7 extest | 111000(38) | Custom | ARM7 |
| 11 | ARM7 intest/BIST | 110010(32) | Custom | ARM7 |

TABLE 5

Single Internal Scan Instructions

| Number | Test Name | Instruction Code | Comment | Register Selected |
|---|---|---|---|---|
| 12 | chain_idc | 100000(20) | Custom | idc |
| 13 | chain_falu | 100101(25) | Custom | falu |
| 14 | chain_mul | 100110(26) | Custom | multiplier |
| 15 | chain_ifu | 100111(27) | Custom | ifu, exe, issue, decode |
| 16 | chain_lsu | 101000(28) | Custom | ehu, lsu cntl, lsu add dp, aiu |
| 17 | chain_mcu | 101001(29) | Custom | mcu, fbus arb, ccu cntl, ccu sm |
| 18 | chain_pci | 101010(2a) | Custom | pci, dma, ad1843, ksl 19 |
| 19 | chain_ifudp | 101011(2b) | Custom | ifu dp, dma dp |
| 20 | chain_lsudp | 101100(2c) | Custom | lsu rd dp, lsu wr dp |
| 21 | chain_ccudp | 101101(2d) | Custom | ccu data dp, ccu addr dp |
| 22 | chain_mcudp | 101110(2e) | Custom | mcu dp |
| 23 | chain_pcidp | 101111(2f) | Custom | pci dp, fbus, i/o bus |
| 24 | chain_bp | 110000(30) | Custom | bp, bp dp, ad1843, ks 119 |
| 25 | chain_codp | 110001(31) | Custom | ad 1843 dp, ks 119 dp |
| 26 | chain_exedp | 110011(33) | Custom | exe dp |
| 27 | chain_io | 110101(35) | Custom | i/o peri, i/o ccu i/f |
| 28 | chain_rf | 110111(37) | Custom | register file |

TABLE 6

Multiple scan instruction

| Number | Test Name | Instruction Code | Comment | Register Selected |
|---|---|---|---|---|
| 29 | Multiple scan chain | 110100(34) | Custom | Bypass Reg. |

TABLE 7

Memory access instruction

| Number | Test Name | Instruction Code | Comment | Register Selected |
|---|---|---|---|---|
| 30 | MCR/BIST 1 | 100001(21) | Custom/Intest | MCR |
| 31 | MCR/BIST 2 | 100010(22) | Custom/Intest | MCR |
| 32 | MCR/BIST 3 | 100011(23) | Custom/Intest | MCR |
| 33 | MCR/BIST 4 | 100100(24) | Custom/Intest | MCR |

TABLE 8

Powerup instruction

| Number | Test Name | Instruction Code | Comment | Register Selected |
|---|---|---|---|---|
| 34 | Powerup | 11110(3d) | Custom | Bypass Reg. |

TABLE 9

Pseudo system clock generation instruction

| Number | Test Name | Instruction Code | Comment | Register Selected |
|---|---|---|---|---|
| 35 | BIST | 000101(05) | Optional, user defined code | Bypass Reg. |
| 36 | GBIST | 111010(3a) | Optional, user defined code | MSP BS Reg. |

TABLE 10

JTAG instruction class for monitoring system behavior

| Number | Test Name | Instruction Code | Comment | Register Selected |
|---|---|---|---|---|
| 37 | Monitor | 111100(3c) | Custom | OCR |

TABLE 11

JTAG instruction class for future application

| Number | Test Name | Instruction Code | Comment | Register Selected |
|---|---|---|---|---|
| 38 | Available for Future | 111100(3e) | Custom | Bypass Reg. |

1.10.4 Special Control Registers

There are two special registers which are controlled by JTAG controller. There are used to control the internal logic or observe the status of the MSP system, the names are MCR (Mode Control Register) and OCR (Observation Control Register). The control signals for each control register are shown below.

TABLE 12

Contents of MCR

| Number | Control Signal | Comments |
|---|---|---|
| 1 | clk_cnt_0 | clock count 0 bit |
| 2 | clk_cnt_1 | clock count 1 bit |
| 3 | clk_cnt_2 | clock count 2 bit |
| 4 | clk_cnt_3 | clock count 3 bit |
| 5 | clk_cnt_4 | clock count 4 bit |
| 6 | clk_cnt_5 | clock count 5 bit |
| 7 | clk_cnt_6 | clock count 6 bit |
| 8 | clk_cnt_7 | clock count 7 bit |
| 9 | clk_cnt_8 | clock count 8 bit |
| 10 | clk_cnt_9 | clock count 9 bit |
| 11 | sys_clk_bypass | All clocks in MSP are bypassed |
| 12 | clk_jtag_cntl | JTAG will control clocks for test clocks |
| 13 | jtag_ack | JTAG acknowledges the signal from clock generator |
| 14 | jtag_clk_stop_req | JTAG wants to stop clock. This is for handshaking between JTAG and core blocks. |
| 15 | cnt_start | Start to generate the system clocks. |
| 16 | start_sdram_access | SDRAM access signals are generated from JTAG controlled SDRAM access sub-module. |
| 17 | em_status | Emulation status. Hooked up to EHU block |
| 18 | jtag_rf_cs | rf cex |
| 19 | mem_data_we | Data RAM write enable, rf we1, rf we2 |
| 20 | mem_vt_we | VD and Tag RAM write enable |
| 21 | mem_add_u/d | Address counter up/down indicator |
| 22 | mem_add_cnt | Address counter count enable |
| 23 | mem_add_reset | Address counter reset signal |
| 24 | mem_add_set | Address counter set signal |
| 25 | mem_vclear | Vclear in SRAM |
| 26 | mem_data_cs | Data RAM select |
| 27 | mem_vt_cs | Vd and Tag RAM select |
| 28 | mem_compare | Compare latch enable |
| 29 | mem_hwd | Hold write data enable in the write register in SRAM |
| 30 | vt_ram_test_en | Vd and Tag RAM test enable |
| 31 | data_ram_test_en | Data RAM test enable |
| 32 | reg_file_test_en | Register file test enable |
| 33 | future slot | |
| 34 | mode_sig_control | Mode signal is controlled from MCR |

TABLE 12-continued

Contents of MCR

| Number | Control Signal | Comments |
|---|---|---|
| 35 | arm_i_mode | Mode signal for ARM7 input boundary scan |
| 36 | arm_o_mode | Mode signal for ARM7 output boundary scan |
| 37 | msp_i_mode | Mode signal for MSP input boundary scan |
| 38 | msp_o_mode | Mode signal for MSP for output boundary scan |
| 39 | msp_c_mode | Mode signal for MSP control boundary scan |
| 40 | jtag_sdram_norm | Notify MCU to use SDRAM |

TABLE 13

| Number | Control Signal | Comments |
|---|---|---|
| 1 | vp_idle | Vp is in IDLE state |
| 2 | req_acom | the request to clock generator has been accomplished |
| 3 | md0 | sdram data bit 0 |
| 4 | md1 | sdram data bit 1 |
| 5 | md2 | sdram data bit 2 |
| 6 | md3 | sdram data bit 3 |
| 7 | md4 | sdram data bit 4 |
| 8 | md5 | sdram data bit 5 |
| 9 | md6 | sdram data bit 6 |
| 10 | md7 | sdram data bit 7 |
| 11 | md8 | sdram data bit 8 |
| 12 | md9 | sdram data bit 9 |
| 13 | md10 | sdram data bit 10 |
| 14 | md11 | sdram data bit 11 |
| 15 | md12 | sdram data bit 12 |
| 16 | md13 | sdram data bit 13 |
| 17 | md14 | sdram data bit 14 |
| 18 | md15 | sdram data bit 15 |
| 19 | md16 | sdram data bit 16 |
| 20 | md17 | sdram data bit 17 |
| 21 | md18 | sdram data bit 18 |
| 22 | md19 | sdram data bit 19 |
| 23 | md20 | sdram data bit 20 |
| 24 | md21 | sdram data bit 21 |
| 25 | md22 | sdram data bit 22 |
| 26 | md23 | sdram data bit 23 |
| 27 | md24 | sdram data bit 24 |
| 28 | md25 | sdram data bit 25 |
| 29 | md26 | sdram data bit 26 |
| 30 | md27 | sdram data bit 27 |
| 31 | md28 | sdram data bit 28 |
| 32 | md29 | sdram data bit 29 |
| 33 | md30 | sdram data bit 30 |
| 34 | md31 | sdram data bit 31 |
| 35 | md32 | sdram data bit 32 |
| 36 | md33 | sdram data bit 33 |
| 37 | md34 | sdram data bit 34 |
| 38 | md34 | sdram data bit 34 |
| 39 | md35 | sdram data bit 35 |
| 40 | md36 | sdram data bit 36 |
| 41 | md37 | sdram data bit 37 |
| 42 | md38 | sdram data bit 38 |
| 43 | md39 | sdram data bit 39 |
| 44 | md40 | sdram data bit 40 |
| 45 | md41 | sdram data bit 41 |
| 46 | md42 | sdram data bit 42 |
| 47 | md43 | sdram data bit 43 |
| 48 | md44 | sdram data bit 44 |
| 49 | md45 | sdram data bit 45 |
| 50 | md46 | sdram data bit 46 |
| 51 | md47 | sdram data bit 47 |
| 52 | md48 | sdram data bit 48 |
| 53 | md49 | sdram data bit 49 |
| 54 | md50 | sdram data bit 50 |
| 55 | md51 | sdram data bit 51 |

TABLE 13-continued

| Number | Control Signal | Comments |
|---|---|---|
| 56 | md52 | sdram data bit 52 |
| 57 | md53 | sdram data bit 53 |
| 58 | md54 | sdram data bit 54 |
| 59 | md55 | sdram data bit 55 |
| 60 | md56 | sdram data bit 56 |
| 61 | md57 | sdram data bit 57 |
| 62 | md58 | sdram data bit 58 |
| 63 | md59 | sdram data bit 59 |
| 64 | md60 | sdram data bit 60 |
| 65 | md61 | sdram data bit 61 |
| 66 | mcu_idle | MCU is in idle |
| 67 | | available for future |
| 68 | | available for future |
| 69 | | available for future |
| 70 | | available for future |

1.10.5 Test Scenarios Using JTAG Instructions 1.10.5.1 Debugging Steps

A debugging process of MSP will involve taking a couple of steps, which are predefined and will be repeated. The brief steps to follow are described below. This is how to use the JTAG instructions during the procedure.

Step 0: Issue cloak stop request: when you want to stop the clock for any reason while MSP is executing its operations, the clock stop flag needs to be issued first. It is issued through JTAG control logic. Then the flag is broadcast to every necessary functional block. JTAG instructions MCR/BIST1 or NCR/BIST2 can be used to issue the signal.

Step 1: Observing internal state: the next step is to know when to step into the JTAG controlled modes from the normal mode. In this mode, the internal state can be observed through OCR (Observation Control Register). The clock stop will not be activated until JTAG observes all signals from all the functional blocks. While MSP is executing its operations, the states can be observed through the TDO pin. The instruction to be used is monitor.

Step 2: stopping the clocks: since the necessary states have been observed, you can stop all types of clocks when the system is idle. Clock stop is required to be able to scan the appropriate scan registers. You can selectively stop the clocks depending on how you set up the values in MCR. You should not scan the cell for the blocks for which normal clock is running. The clock stop signal is being issued while MSP is running with system clock. Any of the four instructions, MCR/BIST1, MCR/BIST2, MCR/BIST3, and MCR/BIST4 can be used to issue the clock stop signal. MCR/BIST1 and MCR/BIST2 can issue the signals while boundary scan cells are in transparent mode. The others can issue the clock stop signals while all input signals are blocked.

Step 3: Scanning the internal states: now, every clock is bypassed, so that there are no free running clocks. You can scan the appropriate blocks. You can use instructions 9–10 to scan the boundary of ARM7 blocks. The instructions 12 through 28 can be used to scan the functional blocks. Instructions 35 and 36 can be used to generate the fast clocks, which are coming from TCK. Before the clocks are restarted, you want to take the necessary setup in MSP. For instance you need to take care of the state machine of generating the half clocks like ARM clock.

step 4: Restarting the clocks: now the system clock can be restarted by setting the values in MCR. The same instructions as in step 2 can be used in this step. Before starting clocks again, the clock stop flag will be reset to logic "0".

1.10.5.2 Manufacturing Test Operation

The manufacturing test mode can be entered using multiple scan instruction. Once decoded for this mode, the MSP is configured as follows.

10 bidirectional pins are configured as input ports 10 bidirectional pins are configured as output ports 1 bidirectional pin is configured as an input port of clk1

1 bidirectional pin is configured as an input port of clk2

1 bidirectional pin is configured as an input port of scan_mode

The other bidirectional pins are controlled as in the normal mode

The ARM7 clock, which is same as I/O clocks is applied as the clk2

PCI clocks use the clk1, clk2

The scan clocks are generated by the two input pins, tca, tcb

All codec clocks are supplied from codec clock ports.

1.10.5.3 ARM7 Execution

ARM7 is executed using the ARM7 intest instruction. The ARM7 boundary scan cells are not transparent. The input and output of ARM7 are applied and observed through the boundary scan chain.

The clock is generated from TCK to speed up the clock application. The three inputs, prog32, data32, and bigend are required to change its signal when mclk is high. To achieve it, the update signal is separate from the update signals of other boundary scan cells.

It should be noted that the mclk is shared with the I/O clock. Once the clock of ARM7 is trigered the state of the other blocks can be changing.

1.10.5.4 Cache and Register File Access

Load the MCR/BIST4 instruction, which selects the MCR as data register and blocks the input and output signals. The bist clock is generated in this mode to speed up the operations. By controlling the MCR, the read and write can be performed.

The clocks which go to cache and register file are muxed with test clock. The memory operation should not disturb the state in other logic blocks.

1.10.5.5 Vector Only Execution

Vector only execution requires considering the output of ARM7 block as the input of VP blocks. Use ARM7 boundary scan access instructions to do it.

1.10.5.6 Intest and Extest

Use intest and extest instructions.

1.10.6 JTAG Interface Signals

TABLE 14

| JTAG controller I/O Signals | |
|---|---|
| Signal Name | Description |
| JTAG input signals | |
| sdram_clk | Same clock as the clock going to SDRAM |
| rasb | RAS signal coming from the boundary scan chain |
| sdram_data[31:0] | Data coming from SDRAM through boundary scan |
| trst_n | JTAG standard pin. Connected to test logic reset pin in MSP, TRSTL. During normal operation, this signal is |

TABLE 14-continued

JTAG controller I/O Signals

| Signal Name | Description |
| --- | --- |
|  | always high. Should have an onchip pull-up register. Please refer to the IEEE Std. 1149.1 for more information. |
| tdi | JTAG standard pin. Connected to TDI pin in MSP. Used for supplying test data for JTAG. During normal operation, this signal is always high. Should have an onchip pull-up register. Please refer to the IEEE Std. 1149.1 for more information. |
| tck | JTAG standard pin. 20 MHZ operation. Connected to TCK pin in MSP. Used for operating JTAG controller and creating the two non-overlapping scan clocks for functional blocks in MSP. During normal operation, this is always low. Please refer to the IEEE Std. 1149.1 for more information. |
| tms | JTAG standard pin. Connected to TMS pin in MSP. Used for test mode selection in JTAG controller. During normal operation, this is always high. Should have an onchip pull-up register. Please refer to the IEEE Std. 1149.1 for more information. |
| tca | Test phase 1 clock. Connected to TCA pin in MSP. Used for supplying the phase 1 clock to every data register in MSP during multiple scan chain operation. This is always low in normal operation. Should have an onchip pull-down register. |
| tcb | Test phase 2 clock. Connected to TCB pin in MSP. Used for supplying the phase 2 clock to every data register in MSP during multiple scan chain operation. This is always low in normal operation. Should have an onchip pull-down register. |
| sysclk | System clock. Connected to system clock pin in MSP. This clock will be divided by 2 internally to create two non-overlapping clocks which go to every data register in MSP during system reset operation. Note: The reset function is not going to be implemented for MSP-1E. |
| sysreset_n | System reset signal. Connected to system reset pin in MSR, RSTL. Used for the reset operation using scan operation. This signal should be guaranteed to stay low during reset operation. The period will be determined after the longest scan chain in MSP is determined. This signal will be tied to VDD in test chip |
| mult_in_1, . . . ~ mult_in_17 | Input signals for re-routing in the multiple scan mode. Connected to either multiple scan input pins in MSP, ad06_siO, ad07_si1, ad08_si2, ad09_si3, ad10_si4, ad11_si5, ad12_si6, ad13_si7, ad14_si8, ad15_si9, or the scan outputs port of functional blocks. The re-routing will be determined after all the scan lengths in functional blocks are fixed. |
| bn_scan_out | Scan output signals from "bn", which is the input to JTAG controller. bn is defined at the bottom. |
| bsr_scan_out | Scan output signal from MSP boundary scan chain. |
| arm7_scan_out | Scan output signal from ARM7 boundary scan chain. |

TABLE 14-continued

JTAG controller I/O Signals

| Signal Name | Description |
| --- | --- |
| dbsr_scan_out | Scan output signal from MSP boundary scan chain for SDRAM access. |
| mult_clk1 | Serve as normal phase 1 clock in the multiple scan mode. It is same as phase 1 system clock. The clock is hooked up to bi-di pin "AD05_MT5". |
| mult_clk2 | Serve as normal phase 2 clock in the multiple scan mode. It is same as phase 2 system clock. The clock is hooked up to bi-di pin "AD04_MT4". |
| mult_scan_mode | Scan mode signal in the multiple scan mode. It is hooked up to bi-directional pin "AD03_MT3". |
| por_n | Power up reset signal. If there is no power up reset signal, tie this to VDD. Whenever MSP is powered up, the JTAG logic is also reset. |

JTAG input signals For OCR register

| Signal Name | Description |
| --- | --- |
| vp_idle | VP is in IDLE state, OCR[0] |
| req_acom | the request to clock generator has been accomplished, OCR[1] |
| ocr_in[34–39] | Signals from the core logic. The core logic signals can be monitored using JTAG controller by assigning to one of these bits. The signal assignment list can be found in the section of "special control registers". |

JTAG Output Signals

| Signal Name | Description |
| --- | --- |
| sdram_bs_csn | SDRAM chip selection. |
| tdo | JTAG standard pin. Connected to TDO pin in MSP. It is the primary port to observe test data output. Please refer to the IEEE Std. 1149.1 for more information. |
| rti | Run test idle state |
| bn_sclka | Phase 1 clock for scan operation. Connected to the phase 1 clock port in block "bn". This clock is derived from the TCK clock. bn is defined at the bottom of this table. |
| bn_sclkb | Phase 2 clock for scan operation. Connected to the phase 2 clock port in block "bn". This clock is derived from the TCK clock. bn is defined at the bottom of this table. |
| sys_clk_bypass | This is obsolete |
| scan_test_mode | System is in scan operation when it is high. Connected to every scan_test_mode port in every functional block. Every illegal behavior will be disabled in the scan mode using this signal. |
| bn_scan_in | Scan input signals for blocks bn. Used in JTAG scan operation and originally coming from the TDI pin in MSP. bn is defined at the bottom of this table. |
| bist_mb1_clk1o | BIST phase 1 clock. Connected to the bist_clk1 port in Clock_Gen block. It is derived from TCK clock. This signal is different from bn_sclka in a sense that this is applied to the normal clock port instead of scan clock ports in the LSSD flipflops and latches. This can be generated only when the instruction MCR/BIST1 is selected and JTAG is in run-test/idle. |
| bist_mb1_clk2o | BIST phase 2 clock. Connected to the bist_clk1 port in Clock_Gen block. It is derived from TCK clock. This signal is different from bn_sclkb in a sense that this is applied to the normal clock port instead of scan |

TABLE 14-continued

JTAG controller I/O Signals

| Signal Name | Description |
| --- | --- |
|  | clock ports in the LSSD flipflops and latches. This can be generated only when the instruction MCR/BIST1 is selected and JTAG is in run-test/idle. |
| bist_mb2_clk1o | BIST phase 1 clock. This can be generated only when the instruction MCR/BIST2 is selected and JTAG is in run-test/idle. |
| bist_mb2_clk2o | BIST phase 2 clock. This can be generated only when the instruction MCR/BIST2 is selected and JTAG is in run-test/idle. |
| bist_mb3_clk1o | BIST phase 1 clock. This can be generated only when the instruction MCR/BIST3 is selected and JTAG is in run-test/idle. |
| bist_mb3_clk2o | BIST phase 2 clock. This can be generated only when the instruction MCR/BIST3 is selected and JTAG is in run-test/idle. |
| bist_mb4_clk1o | BIST phase 1 clock. It is connected to "jtag_mem_clk1" in clock generator block. This can be generated only when the instruction MCR/BIST4 is selected and JTAG is in run-test/idle. |
| bist_mb4_clk2o | BIST phase 2 clock. It is connected to "jtag_mem_clk2" in clock generator block. This can be generated only when the instruction MCR/BIST4 is selected and JTAG is in run-test/idle. |
| bist_arm7_clk1o | BIST phase 1 clock. This can be generated only when the instruction ARM7 intest is selected and JTAG is in run-test/idle. |
| bist_arm7_clk2o | BIST phase 2 clock. It is connected to "jtag_arm_clk" in clock generator block. This can be generated only when the instruction ARM7 intest is selected and JTAG is in run-test/idle. |
| clockdr | JTAG standard signal. Connected to the clockdr port in MSP boundary scan chain. Must have a power of driving 270 boundary scan cells. Clock skew between 1st and 270th bit should be minimal. Please refer to the IEEE Std. 1149.1 for more information. |
| clockdra | Connected to the clockdra port in MSP boundary scan chain, which is LSSD type cell for scan operation. |
| clockdrb | Connected to the clockdrb port in MSP boundary scan chain, which is LSSD type cell for scan operation. |
| updatedr | JTAG standard signal. Connected to the updatedr port in MSP boundary scan chain. Must have a power of driving 270 boundary scan cells. Clock skew between 1st and 270th bit should be minimal. Please refer to the IEEE Std; 1149.1 for more information. |
| shiftdr | JTAG standard signal. Connected to the shiftdr port in MSP boundary scan chain. Must have a power of driving 270 boundary scan cells. Clock skew between 1st and 270th bit should be minimal. Please refer to the IEEE Std. 1149.1 for more information. |
| msp_mode_i | JTAG standard signal. Connected to the input boundary scan mode port in MSP boundary scan chain. Must have a power of driving 270 boundary scan cells. |
| msp_mode_o | JTAG standard signal. Connected to the output boundary scan mode port in MSP boundary scan chain. Must have a power of driving 270 boundary scan cells. |
| msp_mode_c | JTAG standard signal. Connected to the control boundary scan mode port in MSP boundary scan chain. Must have a power of driving 270 boundary scan cells. |
| arm7_mode_i | JTAG standard signal. Connected to the input boundary scan mode port in ARM7 boundary scan chain. Must have a power of driving 124 boundary scan cells. Clock skew between 1st and 124th bit should be minimal. |
| arm1_mode_o | JTAG standard signal. Connected to the output boundary scan mode port in ARM7 boundary scan chain. Must have a power of driving 124 boundary scan cells. Clock skew between 1st and 124th bit should be minimal. |
| arm7_bs_disable | ARM7 boundary scan disable signal. Connected to the enb port in arm hs block. Disables the updating the arm7 core boundary scan chain by blocking the TCK. Must have a power of driving 100 boundary scan cells. |
| set_n | TCK to boundary scan cells is disabled when it is low. The two different boundary scan chains can be independently disabled by turning on this signal (low) in ARM7 boundary scan chain when it is accessing MSP boundary scan chain. |
| msp_bs_disable | MSP boundary scan disable signal. Connected to the enb port in msp_bs block. Disables the updating the MSP boundary scan chain by blocking the TCK. Must have a power of driving 270 boundary scan cells. |
| ins[31:0] | all JTAG instruction signals. All necessary signals are generated using this signal later. |

JTAG Output Signals From MCR register

| Signal Name | Description |
| --- | --- |
| mem_data_we | Data RAM write enable signal in memory access operation. |
| mem_vt_we | Vd and Tag RAM write enable in memory access operation. |
| mem_add_u/d | Memory address up or down enable signal. Connected to the u/d port in the address counter. Operated with mem_add_cnt signal. Used in memory access operation. |
| mem_add_cnt | Memory address count enable signal. Connected to the cnt port in the address counter. Operated with mem_add_u/d signal. Used in memory access operation. |
| mere_add_reset | Memory address counter synchronous reset signal. Connect to the reset port in the address counter. |
| mem_add_set | Memory address counter synchronous set signal. Connect to the set port in the address counter. |
| men_vclear | Vd RAM clear signal in memory access mode. |
| mem_data_cs | Data RAM chip select signal in memory access mode |
| mem_vt_cs | Vd and Tag RAM chip select signal in memory access mode |
| mem_compare | Compare enable signal during memory test. Connected to the compare enable signals in cache memory block. |
| mem_hwd | Hold the data values in write register in cache during memory access mode. |
| future_ram_test_en | RAM test enable signal. This is for future application. It is always low |

TABLE 14-continued

JTAG controller I/O Signals

| Signal Name | Description |
| --- | --- |
| | in other periods. |
| vt_ram_test_en | Vd and Tag RAM select signal in memory access operation. It is always low in other periods. |
| dam_ram_test_en | Data RAM select signal in memory access operation. It is always low in other periods. |
| reg_file_test_en | Register file select signal in memory access operation. It is always low in other periods. |
| jtag_rf_cex | Register file chip selection signal |
| start_sdram_access | SDRAM access signals are generated. |

| Signal Name | Description |
| --- | --- |
| bn in signal names represents one of the following:<br>• rf: register file<br>• idc: IDC block<br>• ied: IFU, EXU, CCU, Decode, Issue<br>• lae: LSU, AIU, Exception Handler<br>• pda: PCI, DMA<br>• mf: MCU, FBUS, FBUS Arbiter<br>• bci: Bit stream, Codec I/F blocks<br>• iof: I/O Peripheral<br>• falu: FALU<br>• exu_dp: EXU datapath<br>• mul: Multiplier<br>• ifdm_dp: IFU datapath, DMA datapath<br>• lsu_dp: LSU r/w datapath<br>• ccu_dp: CCU datapath, CCU address datapath<br>• mcueh_dp: MCU datapath, EHU datapath<br>• pcibp_dp: PCI datapath, BP datapath<br>• codec_dp: Codec 119 datapath, Codec 1843 datapath | |

All JTAG interface signals are listed in table 11.

1.11 Hardware Test Environment

Figure 7:
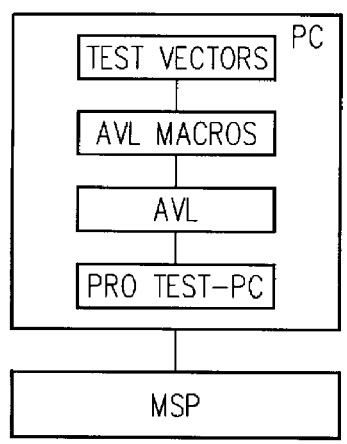
FIG. 7 shows the MSP hardware test environment.

The hardware test environment is shown in FIG. 7. AVL (ASCII Vector Language) is both a test vector language, designed specifically for boundary scan testing, and a boundary scan test tool. It merges traditional parallel vector oriented Automated Test Equipment (ATE) languages with serial boundary scan testing defined by IEEE Standard 1149.1.

The proTest-PC is a PC-based test controller board capable of generating and receiving IEEE Std 1149.1 signals for testing components, boards and systems. AVL and proTest-PC are the products of AIS (Alpine Image Systems, Inc.).

During test process, all the test vectors for MSP will be formatted serially via AVL language and applied to MSP through proTest-PC board. Test vectors are the vectors which are applied to MSP I/O or scan chains. To ease the test vector application for all functional blocks, which is performed serially, AVL macros need to be developed to access particular location in scan chains. The communication will be made through JTAG 5 pins only. Please refer to following documents for more information.

AVL User's Guide, V1.80, Alpine Image Systems, Inc, 1995

User's Guide for proTEST-PC, V3.01, Alpine Image Systems, Inc, 1995

1.12 Embedded RAM Test Scheme

1.12.1 IDC

Figure 8:
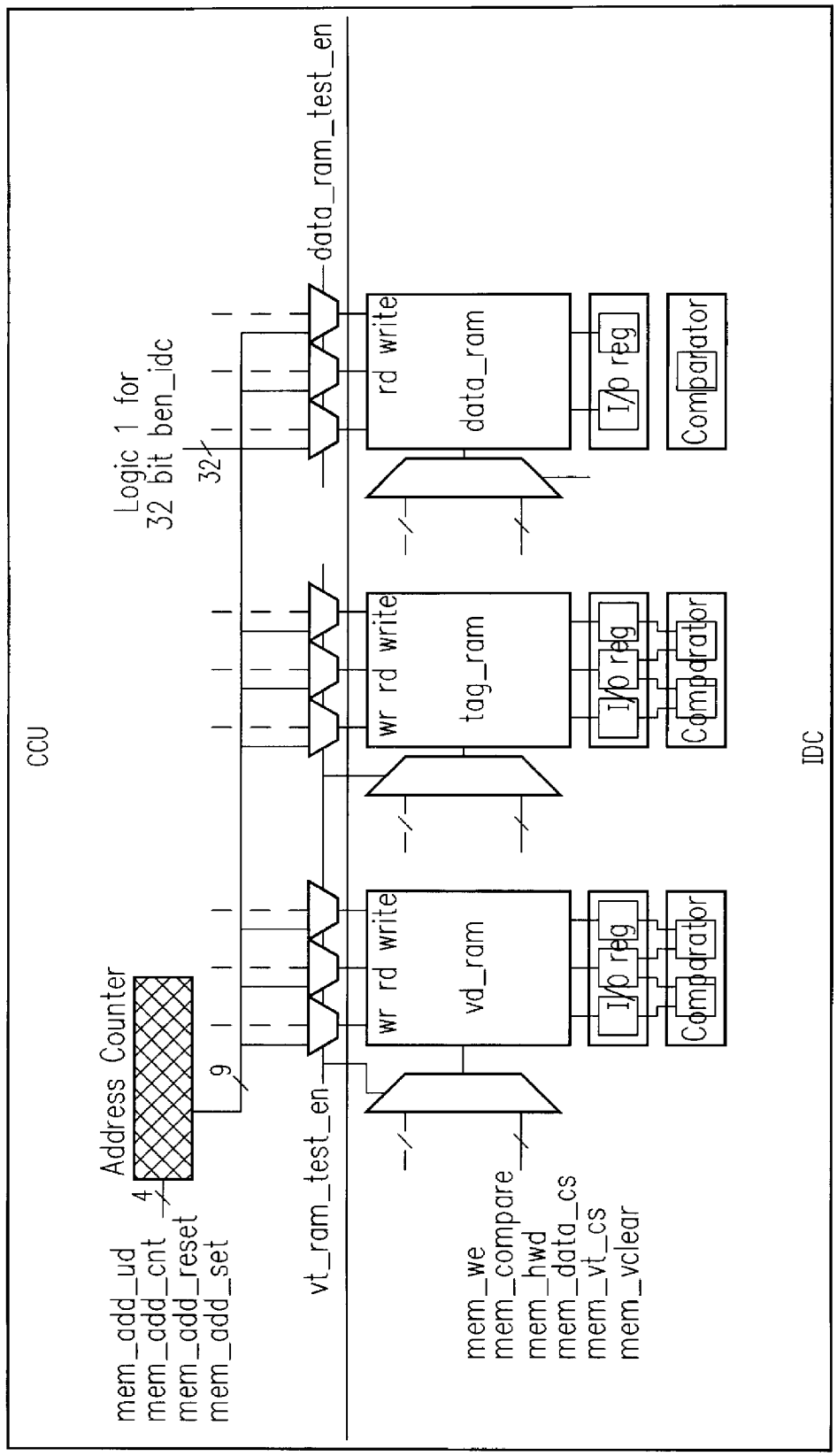
FIG. 8 shows the IDC block test scheme.

FIG. 8 shows the test scheme for IDC block. Test logics are inserted to blocks, CCU and IDC. All dotted lines stand for the signals in normal mode. CCU block provides the mux logics for the addresses in test and normal modes. Address is generated with 9 bit counter with set, reset, up/down, and count enable functions. All counter operation should be synchronous with the system clock, clk1. The four counter control signals, mem_add_ud, mem_add_cnt, mem_add_reset, and mem_add_set, are provided by JTAG controller. The first two bits in the MSB side need to be connected for the bank selection.

32 bit ben_idc signals are set to logic 1 during testing the memory. There are two signals which select between test and normal signals. Vt_ram_test_en is for testing vd_ram and tag_ram. Data_ram_test_en is for data_ram testing. If the signals are logic high, test data is selected.

IDC blocks have comparators embedded for automatic comparison while MARCH C algorithm is being applied. There are 6 memory control signals which are also provided by JTAG controller. Mem_compare enables the comparison between input and output registers. If there is any error occurred, the output of comparator will produce logic 0. Otherwise, it is logic 1. All the I/O registers are in scan chain, through which input and output access can be made.

Mem_hwd signal enables holding the data in the write register when it is logic 1. Please refer to MSP spec. for other memory control signals, mem_we, mem_data_cs, mem_vt_cs, and mem_vclear. The names are the same as in the normal mode signals except they starts from "mem".

1.12.2 Register File

The test scheme specified for the register file is targeted to easily access the register file in test mode. Since there is no comparator logic embedded as in IDC, it is not practical to apply MARCH type algorithm to this memory.

Figure 9:
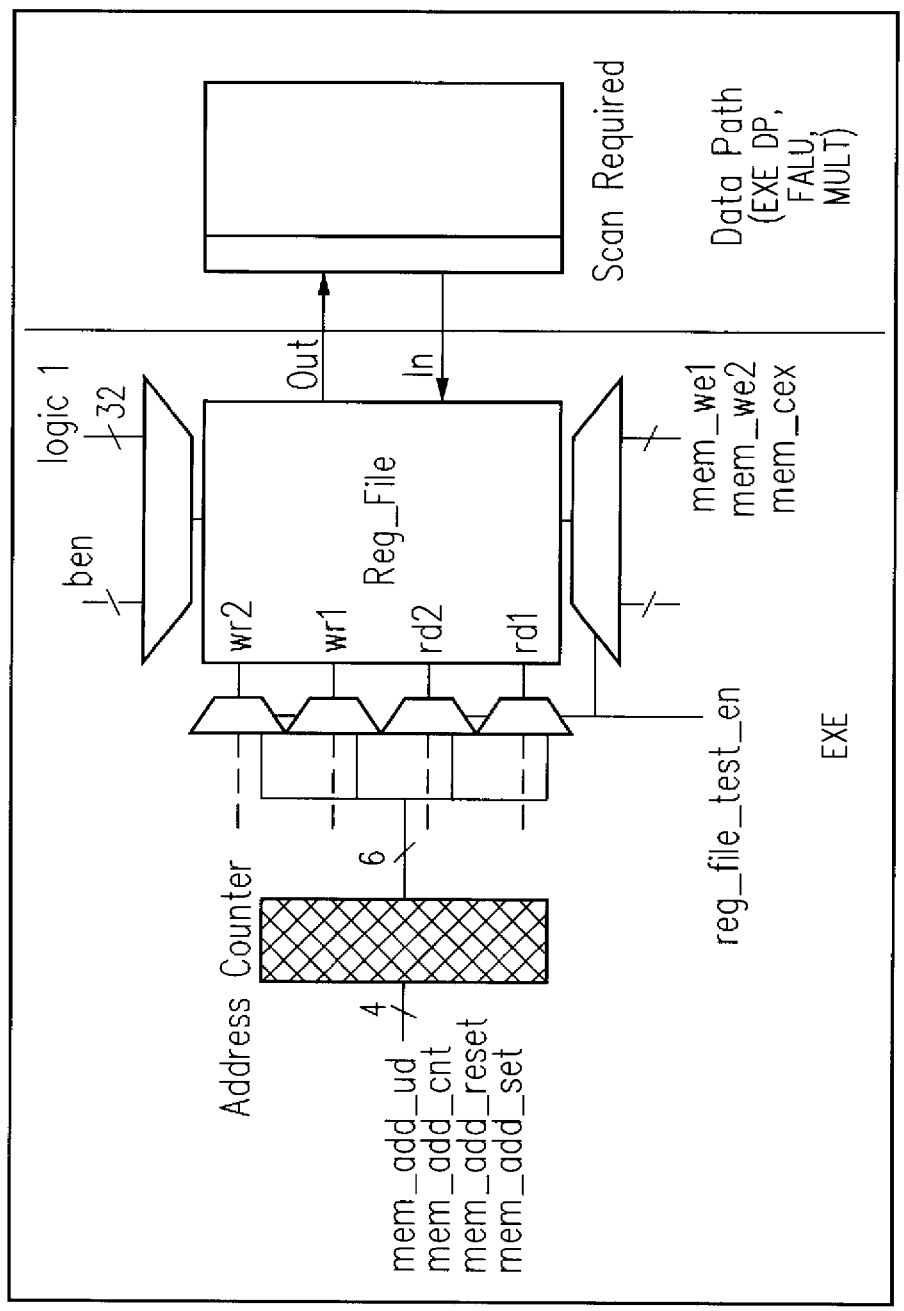
FIG. 9 shows the register file test scheme.

FIG. 9 (register file test scheme) shows the overall scheme for test environment. The dotted lines represent the normal signals. There are three regions, data path, reg_file, and EXE block. All the logic in the left hand side of the bold line belongs to EXE block except the reg_file block. The EXE block provides the mux logic to select the address and control signals between test and normal modes. The test mode selection signal, reg_file_test_en and the three memory control signals, mem_we1, mem_we2, and mem_cex are provided by the JTAG control logic. If reg_file_test_en is high, test data is selected.

The addresses are generated by 6 bit counter with set, reset, up and down, and count enable. All count operation are synchronous with system clock, clk1. The input and output registers are located in data path blocks as specified in the FIG. 9. All the I/O registers need to be scanned. 32 bit ben signals are tied to logic 1 in the test mode.

Free running clock is provided to register file. Capture scan register is attached to the output of it.

1.13 MSP Boundary Scan

All the I/O pads in MSP have appropriate boundary scan cells. There are 270 boundary scan cells connected in one scan chain. The sequence and cells are listed in table 13.

1.13.1 Boundary Scan Cell Selection

The current available JTAG cells in KGL75 are listed below. Their matching JTAG standard cells are shown in table 15. The boundary scan chain for MSP uses the LSSD type scan cells. The difference from the KGL75 is using two non overlapping clocks to shift through boundary scan chain. KGL75 boundary scan cells are used for boundary scan of ARM7.

JTBl1: Bi-directional I/O boundary scan cell.

JTCK: Special input, such as clock input, boundary scan cell

JTIN1: Input boundary scan cell

JTINT1: Three-state control internal boundary-scan cell
JTOUT1: Output boundary scan cell The rules of selecting appropriate boundary scan cells are stated below.

TABLE 15

Matching table of boundary scan cell between KGL75 vs. JTAG standard

| KGL75 | STANDARD |
|---|---|
| JTB1IN | BC_2 |
| JTB1OUT | BC_1 |
| JTINT1 | BC_1 |
| JTOUT1 | BC_1 |
| JTIN1 | BC_2 |
| JTCK | BC_4 |

For every input cell including clock inputs except GND, VDD, and VCC pins, use JTIN1.

For every bidirectional cells, use JTBI1.

For every output cells, use JTOUT1.

For t/s(tri-state) pins, add a JTINT1 cell. Use only one tri-state control cell for a group of signals such as AD[31:0].

For the pins with o/d(open drain), Use a JTINT1 cell.

For the pins with s/t/s(ststained tri-state) is same as t/s in terms of boundary scan cell selection.

1.13.2 Boundary Scan Cell Sequence

The boundary scan is chained in the counter-clock direction from TDI input. Please refer to MSP pin layout for more information.

Input cell comes first in case of bidirectional pins.

If there is tri-state pins, the tri-state control boundary scan cell, JTINT1, comes before the cells.

If there are many tri-state pins in a sequence, only one tri-state control cell is inserted before the first tri-state pins in the sequence.

1.13.3 Design Details

All ADxx signals have the same tri-state enable signals. So only one control boundary scan cell is enough to control 32 bit AD signals. However, to properly control the signals in the multiple scan mode, four more control boundary scan cells have been inserted. As a result, a total of five control boundary scan cells is used for AD bus. The five control boundary scan cells take one normal control signal from MSP core and produce five control signals.

TABLE 16

Boundary scan order for MSP

| PIN # | Name | Type | BS Cell | Tri-state Control same as | BS Scan Order |
|---|---|---|---|---|---|
| | | | JTINT1 | | |
| 1 | AD31 | I/O t/s | JTBI1 | | pin 1 |
| 2 | AD30 | I/O t/s | JTBI1 | | pin 1 |
| 3 | AD29 | I/O t/s | JTBI1 | | pin 1 |
| 4 | AD28 | I/O t/s | JTBI1 | | pin 1 |
| 5 | GND | IN | N/A | | |
| 6 | AD27 | I/O t/s | JTBI1 | | pin 1 |
| 7 | AD26 | I/O t/s | JTBI1 | | pin 1 |
| | | | JTINT1 | | |
| 8 | AD25_SO9 | I/O t/s | JTBI1 | | pin 8 |
| 9 | AD24_SO8 | I/O t/s | JTBI1 | | pin 8 |
| | | | JTINT1 | | |

TABLE 16-continued

Boundary scan order for MSP

| PIN # | Name | Type | BS Cell | Tri-state Control same as | BS Scan Order |
|---|---|---|---|---|---|
| 10 | C_BE3L | I/O t/s | JTBI1 | | pin 10 |
| 11 | VCC | IN | N/A | | |
| 12 | IDSEL | IN | JTIN1 | | |
| 13 | AD23_SO7 | I/O t/s | JTBI1 | | pin 8 |
| 14 | GND | IN | N/A | | |
| 15 | AD22_SO6 | I/O t/s | JTBI1 | | pin 8 |
| 16 | AD21_SO5 | I/O t/s | JTBI1 | | pin 8 |
| 17 | AD20_SO4 | I/O t/s | JTBI1 | | pin 8 |
| 18 | AD19_SO3 | I/O t/s | JTBI1 | | pin 8 |
| 19 | AD18_SO2 | I/O t/s | JTBI1 | | pin 8 |
| 20 | AD17_SO1 | I/O t/s | JTBI1 | | pin 8 |
| 21 | AD16_SO0 | I/O t/s | JTBI1 | | pin 8 |
| 22 | C_BE2L | I/O t/s | JTBI1 | | pin 10 |
| 23 | GND-1 | IN | N/A | | |
| | | | JTINT1 | | |
| 24 | FRAMEL | I/O s/t/s | JTBI1 | | independent |
| | | | JTINT1 | | |
| 25 | IRDYL | I/O s/t/s | JTBI1 | | independent |
| | | | JTINT1 | | |
| 26 | TRDYL | I/O s/t/s | JTBI1 | | independent |
| | | | JTINT1 | | |
| 27 | DVSELL | I/O s/t/s | JTBI1 | | independent |
| | | | JTINT1 | | |
| 28 | STOPL | I/O s/t/s | JTBI1 | | independent |
| | | | JTINT1 | | |
| 29 | LOCKL | I/O s/t/s | JTBI1 | | independent |
| | | | JTINT1 | | |
| 30 | PERRL | I/O s/t/s | JTBI1 | | independent |
| | | | JTINT1 | | |
| 31 | SERRL | I/O o/d | JTBI1 | | independent |
| 32 | GND | IN | N/A | | |
| 33 | VDD | IN | N/A | | |
| 34 | TCA | IN | JTIN1 | | |
| | | | JTINT1 | | |
| 35 | PAR | I/O t/s | JTBI1 | | independent |
| 36 | C_BE1L | I/O t/s | JTBI1 | | pin 10 |
| | | | JTINT1 | | |
| 37 | AD15_SI9 | I/O t/s | JTBI1 | | pin 37 |
| 38 | AD14_SI8 | I/O t/s | JTBI1 | | pin 37 |
| 39 | AD13_SI7 | I/O t/s | JTBI1 | | pin 37 |
| 40 | GND | IN | N/A | | |
| 41 | AD12_SI6 | I/O t/s | JTBI1 | | pin 37 |
| 42 | AD11_SI5 | I/O t/s | JTBI1 | | pin 37 |
| 43 | AD10_SI4 | I/O t/s | JTBI1 | | pin 37 |
| 44 | AD09_SI3 | I/O t/s | JTBI1 | | pin 37 |
| 45 | AD08_512 | I/O t/s | JTBI1 | | pin 37 |
| 46 | C_BE0L | I/O t/s | JTBI1 | | pin 10 |
| 47 | TCB | IN | JTIN1 | | |
| 48 | GND | IN | N/A | | |
| 49 | MCKE | OUT | JTOUT | | |
| 50 | AD07_SI1 | I/O t/s | JTBI1 | | pin 37 |
| 51 | AD06_SI0 | I/O t/s | JTBI1 | | pin 37 |
| 52 | VCC | IN | N/A | | |
| 53 | GND | IN | N/A | | |
| | | | JTINT1 | | |
| 54 | AD05_MT5 | I/O t/s | JTBI1 | | pin 54 |
| 55 | AD04_MT4 | I/O t/s | JTBI1 | | pin 54 |
| 56 | AD03_MT3 | I/O t/s | JTBI1 | | pin 54 |
| | | | JTINT1 | | |
| 57 | AD02_MT2 | I/O t/s | JTBI1 | | pin 57 |
| 58 | AD01_MT1 | I/O t/s | JTBI1 | | pin 57 |
| 59 | AD00_MT0 | I/O t/s | JTBI1 | | pin 57 |
| 60 | GND | IN | N/A | | |
| 61 | MA11 | OUT | JTOUT1 | | |
| 62 | MA10 | OUT | JTOUT1 | | |
| 63 | MA9 | OUT | JTOUT1 | | |
| 64 | MA8 | OUT | JTOUT1 | | |
| 65 | MA7 | OUT | JTOUT1 | | |
| 66 | GND | IN | N/A | | |
| 67 | VDD | IN | N/A | | |
| 68 | MA6 | OUT | JTOUT1 | | |
| 69 | MA5 | OUT | JTOUT1 | | |
| 70 | MA4 | OUT | JTOUT1 | | |

TABLE 16-continued

Boundary scan order for MSP

| PIN # | Name | Type | BS Cell | Tri-state Control same as | BS Scan Order |
|---|---|---|---|---|---|
| 71 | MA3 | OUT | JTOUT1 | | |
| 72 | MA2 | OUT | JTOUT1 | | |
| 73 | GND-1 | IN | N/A | | |
| 74 | MA1 | OUT | JTOUT1 | | |
| 75 | MA0 | OUT | JTOUT1 | | |
| 76 | RAS1L | OUT | JTOUT1 | | |
| 77 | CAS1L | OUT | JTOUT1 | | |
| 78 | VDD | IN | N/A | | |
| 79 | GND | IN | N/A | | |
| 80 | MEMCLK | OUT | JTCK | | |
| 81 | MWE1L | OUT | JTOUT1 | | |
| 82 | DQM | OUT | JTOUT1 | | |
| 83 | MCS1 | OUT | JTOUT1 | | |
| | | | JTINT1 | | |
| 84 | MD0 | I/O t/s | JTBI1 | pin 84 | |
| 85 | MD1 | I/O t/s | JTBI1 | pin 84 | |
| 86 | MD2 | I/O t/s | JTBI1 | pin 84 | |
| 87 | MD3 | I/O t/s | JTBI1 | pin 84 | |
| 88 | GND | IN | N/A | | |
| 89 | MD4 | I/O t/s | JTBI1 | pin 84 | |
| 90 | MD5 | I/O t/s | JTBI1 | pin 84 | |
| 91 | MD6 | I/O t/s | JTBI1 | pin 84 | |
| 92 | MD7 | I/O t/s | JTBI1 | pin 84 | |
| 93 | GND | IN | N/A | | |
| 94 | VDD | IN | N/A | | |
| 95 | MD8 | I/O t/s | JTBI1 | pin 84 | |
| 96 | MD9 | I/O t/s | JTBI1 | pin 84 | |
| 97 | MD10 | I/O t/s | JTBI1 | pin 84 | |
| 98 | MD11 | I/O t/s | JTBI1 | pin 84 | |
| 99 | GND | IN | N/A | | |
| 100 | MD12 | I/O t/s | JTBI1 | pin 84 | |
| 101 | MD13 | I/O t/s | JTBI1 | pin 84 | |
| 102 | MD14 | I/O t/s | JTBI1 | pin 84 | |
| 103 | MD15 | I/O t/s | JTBI1 | pin 84 | |
| 104 | VDD | IN | N/A | | |
| 105 | GND | IN | N/A | | |
| 106 | MD16 | I/O t/s | JTBI1 | pin 84 | |
| 107 | MD17 | I/O t/s | JTBI1 | pin 84 | |
| 108 | MD18 | I/O t/s | JTBI1 | pin 84 | |
| 109 | MD19 | I/O t/s | JTBI1 | pin 84 | |
| 110 | MD20 | I/O t/s | JTBI1 | pin 84 | |
| 111 | GND | IN | N/A | | |
| 112 | MD21 | I/O t/s | JTBI1 | pin 84 | |
| 113 | MD22 | I/O t/s | JTBI1 | pin 84 | |
| 114 | MD23 | I/O t/s | JTBI1 | pin 84 | |
| 115 | MD24 | I/O t/s | JTBI1 | pin 84 | |
| 116 | VDD | IN | N/A | | |
| 117 | MD25 | I/O t/s | JTBI1 | pin 84 | |
| 118 | MD26 | I/O t/s | JTBI1 | pin 84 | |
| 119 | GND | IN | N/A | | |
| 120 | MD27 | I/O t/s | JTBI1 | pin 84 | |
| 121 | VDD | IN | N/A | | |
| 122 | MD28 | I/O t/s | JTBI1 | pin 84 | |
| 123 | MD29 | I/O t/s | JTBI1 | pin 84 | |
| 124 | MD30 | I/O t/s | JTBI1 | pin 84 | |
| 125 | MD31 | I/O t/s | JTBI1 | pin 84 | |
| | | | JTINT1 | | |
| 126 | 43SDFS | I/O t/s | JTBI1 | independent | |
| | | | JTINT1 | | |
| 127 | 43SCLK | I/O t/s | JTBI1 | independent | |
| 128 | VCC | IN | N/A | | |
| 129 | GND | IN | N/A | | |
| | | | JTINT1 | | |
| 130 | 43SDI | OUT t/s | JTOUT1 | independent | |
| 131 | 43SDO | IN | JTIN1 | | |
| 132 | RI | IN | JTIN1 | | |
| 133 | LCS | IN | JTIN1 | | |
| | | | JTINT1 | | |
| 134 | CALRID | OUT t/s | JTOUT1 | independent | |
| 135 | GND | IN | N/A | | |
| | | | JTINT1 | | |
| 136 | PD15 | OUT t/s | JTOUT1 | independent | |
| 137 | PD14_PA14 | OUT t/s | JTOUT1 | pin 136 | |
| 138 | PD13_PA13 | OUT t/s | JTOUT1 | pin 136 | |
| 139 | PD12_PA12 | OUT t/s | JTOUT1 | pin 136 | |
| 140 | PD11_PA11 | OUT t/s | JTOUT1 | pin 136 | |
| 141 | PD10_PA10 | OUT t/s | JTOUT1 | pin 136 | |
| 142 | PD9_PA9 | OUT t/s | JTOUT1 | pin 136 | |
| 143 | PD8_PA8 | OUT t/s | JTOUT1 | pin 136 | |
| 144 | BGCLK | IN | JTIN1 | | |
| 145 | VDD | IN | N/A | | |
| 146 | GND | IN | N/A | | |
| 147 | PD7_PA7 | OUT t/s | JTBI1 | pin 136 | |
| 148 | PD6_PA6 | OUT t/s | JTBI1 | pin 136 | |
| 149 | PD5_PA5 | OUT t/s | JTBI1 | pin 136 | |
| 150 | PD4_PA4 | OUT t/s | JTBI1 | pin 136 | |
| 151 | PD3_PA3 | OUT t/s | JTBI1 | pin 136 | |
| 152 | PD2_PA2 | OUT t/s | JTBI1 | pin 136 | |
| 153 | PD1_PA1 | OUT t/s | JTBI1 | pin 136 | |
| 154 | PD0_PA0 | OUT t/s | JTBI1 | pin 136 | |
| 155 | VCC | IN | N/A | | |
| 156 | PROMCSL | OUT | JTOUT1 | | |
| 157 | BGVS | IN | JTIN1 | | |
| 158 | BGHS | IN | JTIN1 | | |
| 159 | VCC | IN | N/A | | |
| 160 | GND | IN | N/A | | |
| | | | JTINT1 | | |
| 161 | SCLK | OUT t/s | JTOUT1 | independent | |
| | | | JTINT1 | | |
| 162 | SDAT | I/O t/s | JTBI1 | independent | |
| | | | JTINT1 | | |
| 163 | SFRS | OUT t/s | JTOUT1 | independent | |
| | | | JTINT1 | | |
| 164 | RSTOL | OUT t/s | JTOUT1 | independent | |
| | | | JTINT1 | | |
| 165 | MSSEL | OUT t/s | JTOUT1 | independent | |
| 166 | CK2 | IN | JTIN1 | | |
| 167 | VCC | IN | N/A | | |
| 168 | GND | IN | N/A | | |
| 169 | CK | IN | JTIN1 | | |
| 170 | MIDIIN | IN | JTIN1 | | |
| 171 | TM | IN | JTIN1 | | |
| 172 | GND | IN | N/A | | |
| 173 | VS | IN | JTIN1 | | |
| 174 | HS | IN | JTIN1 | | |
| 175 | HREF | IN | JTIN1 | | |
| | | | JTINT1 | | |
| 176 | MIDIO | OUT t/s | JTOUT1 | independent | |
| 177 | MSPCK | IN | JTCK | | |
| 178 | GND | IN | N/A | | |
| 179 | C7 | IN | JTIN1 | | |
| 180 | C6 | IN | JTIN1 | | |
| 181 | C5 | IN | JTIN1 | | |
| 182 | C4 | IN | JTIN1 | | |
| 183 | C3 | IN | JTIN1 | | |
| 184 | C2 | IN | JTIN1 | | |
| 185 | C1 | IN | JTIN1 | | |
| 186 | C0 | IN | JTIN1 | | |
| 187 | GND | IN | N/A | | |
| 188 | VDD | IN | N/A | | |
| 189 | Y7 | IN | JTIN1 | | |
| 190 | Y6 | IN | JTIN1 | | |
| 191 | Y5 | IN | JTIN1 | | |
| 192 | Y4 | IN | JTIN1 | | |
| 193 | Y3 | IN | JTIN1 | | |
| 194 | Y2 | IN | JTIN1 | | |
| 195 | Y1 | IN | JTIN1 | | |
| 196 | Y0 | IN | JTIN1 | | |
| 197 | TRSTL | IN | N/A | | |
| 198 | TDI | IN | N/A | | |
| 199 | TCK | IN | N/A | | |
| 200 | TDO | OUT | N/A | | |
| 201 | TMS | IN | N/A | | |
| | | | JTINT1 | | |
| 202 | INTAL | OUT o/d | JTOUT1 | independent | |
| 203 | RSTL | IN | JTIN1 | | |

TABLE 16-continued

Boundary scan order for MSP

| PIN # | Name | Type | BS Cell | Tri-state Control same as | BS Scan Order |
|---|---|---|---|---|---|
| 204 | PCICLK | IN | JTIN1 | | |
| 205 | GND | IN | N/A | | |
| 206 | GNTL | IN | JTIN1 JTINT1 | | |
| 207 | REQL | OUT t/s | JTOUT1 | independent | |
| 208 | VCC | IN | N/A | | |

1.14 ARM7 Boundary Scan

The boundary scan cell selection has been treated as the way in the MSP boundary scan cell selection. Refer to the previous section for more information. The names and scan order are described in the table 14.

TABLE 17

Boundary scan cell order for ARM7

| Scan Order | Name | Type | Width | Description | BSC type |
|---|---|---|---|---|---|
| 1 | mclk | input | 1 | clock | JTCK |
| 2 | Nwait | input | 1 | clock | JTIN1 |
| 3 | prog32 | input | 1 | configuration | JTIN1 |
| 4 | data32 | input | 1 | configuration | JTIN1 |
| 5 | bigend | input | 1 | configuration | JTIN1 |
| 6 | Nexec | output | 1 | | JTOUT1 |
| 7 | Nirq | input | 1 | interrupts | JTIN1 |
| 8 | Nfiq | input | 1 | interrupts | JTIN1 |
| 9 | Nreset | input | 1 | JTIN1 | |
| 10 | ale | input | 1 | bus control | JTIN1 |
| 11 | dbe | input | 1 | bus control | JTIN1 |
| 12–16 | Nm | output | 5 | processor mode | JTOUT1 |
| 17–48 | a | output | 32 | memory interface | JTOUT1 |

What is claimed is:

1. A method for operating an integrated circuit which includes at least one functional logic block operating with a system clock at a first clock speed and a test port operating with a test clock at a second clock speed, the second clock speed being lower than the first clock speed, the test port being controlled by a test controller external to the integrated circuit, the method comprising the steps of:

selecting as a scan address a first control register containing first control values being provided to the functional block, via the test port with a first test instruction;

shifting second control values into the first control register at the second clock speed, the first control values being provided to the functional logic block, not changing during the shifting;

loading the updated control values from a first portion into a second portion of the control register to provide the updated control values to the functional logic block;

wherein, the second control values include a stop clock flag request bit, indicating to the functional logic that the test controller wishes to stop the system clocks, and wherein, the second control values are shifted into the first control register while the system clock is being provided to the functional block, and wherein, the functional logic responds to assertion of the stop clock flag request bit by going into an idle state by completion of pending instructions in an instruction stack and providing an idle signal to a second control register indicating that the functional logic has gone to the idle state.

2. A method as recited in claim 1 further comprising the steps of:

monitoring the state of the second control register through the test port to determine when the idle signal is asserted by the functional logic;

once the idle signal has been detected by the test controller, shifting and loading second control values, the third control values including a stop clocks control bit asserted to indicate to a clock control logic block, to stop system clocks, to thereby stop the system clocks.

3. A method for operating an integrated circuit which includes at least one functional logic block operating with a system clock at a first clock speed and a test port operating with a test clock at a second clock speed, the second clock speed being lower than the first clock speed, the test port being controlled by a test controller external to the integrated circuit, the method comprising the steps of:

selecting as a scan address a first control register containing first control values being provided to the functional block, via the test port with a first test instruction;

shifting second control values into the first control register at the second clock speed, the first control values being provided to the functional logic block, not changing during the shifting;

loading the updated control values from a first portion into a second portion of the control register to provide the updated control values to the functional logic block;

shifting and loading the first control register to specify a count value of the number of clock cycles which should be provided by a clock control logic circuit; and executing the specified number of clock cycles at one of the first clock speed and the second clock speed according to control bits in the first control register.

4. An integrated circuit comprising:

a test port operating at a first clock speed;

at least one functional block operating at a second clock speed which is faster than the first clock speed;

a control register, formed by boundary scan cells, operating at the first clock speed, providing control inputs to the functional block to control emulation tasks of the functional block, the control register being writable via a serial shift operation through the test port while the functional block is operating, the outputs of the control register which are being provided to the functional block being constant during the serial shift operation;

an observation register, formed by boundary scan cells, operating at the first clock speed, which is readable through the test port via a serial shift operation, while the functional block is operating, the observation register receiving inputs indicating status of the functional block; and wherein the control register includes a plurality of bits indicating a clock count, the clock count indicating to a clock control circuit to provide a number of clock cycles represented by the clock count, the control register further including bits provided to the clock control circuit, indicating whether the clock control circuit should issue the number of clock cycles at the first or second clock frequency.

5. An integrated circuit comprising:

a test port operating at a first clock speed;

at least one functional block operating at a second clock speed which is faster than the first clock speed;

a control register, formed by boundary scan cells, operating at the first clock speed, providing control inputs to the functional block to control emulation tasks of the functional block, the control register being writable via a serial shift operation through the test port while the functional block is operating, the outputs of the control register which are being provided to the functional block being constant during the serial shift operation;

an observation register, formed by boundary scan cells operating at the first clock speed, which is readable through the test port via a serial shift operation, while the functional block is operating, the observation register receiving inputs indicating status of the functional block;

a plurality of boundary scan strings, comprised of boundary scan cells, each cell receiving a mode signal as a multiplexer select signal; and wherein the control register includes a mode override control bit indicating to override test port mode control of the boundary scan strings, the control register further including mode control bits, one of the mode control bits being provided to each of the boundary scan strings to control the mode signal to each boundary scan string when the mode override control bit is asserted.

* * * * *